United States Patent
Yang et al.

(10) Patent No.: US 11,765,943 B2
(45) Date of Patent: Sep. 19, 2023

(54) ARRAY SUBSTRATE AND MANUFACTURING METHOD THEREFOR, DISPLAY DEVICE, AND MASK PLATE

(71) Applicant: BOE TECHNOLOGY GROUP CO., LTD., Beijing (CN)

(72) Inventors: Qian Yang, Beijing (CN); Lujiang Huangfu, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 262 days.

(21) Appl. No.: 17/281,606

(22) PCT Filed: May 8, 2020

(86) PCT No.: PCT/CN2020/089118
§ 371 (c)(1),
(2) Date: Mar. 31, 2021

(87) PCT Pub. No.: WO2020/228594
PCT Pub. Date: Nov. 19, 2020

(65) Prior Publication Data
US 2021/0391396 A1 Dec. 16, 2021

(30) Foreign Application Priority Data

May 13, 2019 (CN) .......................... 201910394681.7

(51) Int. Cl.
*H01L 27/32* (2006.01)
*H01L 51/56* (2006.01)
(Continued)

(52) U.S. Cl.
CPC ............. *H10K 59/122* (2023.02); *G03F 1/00* (2013.01); *G03F 1/38* (2013.01); *H10K 59/351* (2023.02);
(Continued)

(58) Field of Classification Search
CPC ......... H01L 27/3211–3218; H10K 59/35–353; H10K 59/122; G03F 1/36; G03F 1/38
See application file for complete search history.

(56) References Cited

U.S. PATENT DOCUMENTS 10,903,281 B2 1/2021 Chung et al.
10,943,955 B2 * 3/2021 Wang ................... H10K 59/352
(Continued)

FOREIGN PATENT DOCUMENTS

CN 104281000 A * 1/2015 ............... G03F 1/38
CN 104281000 A 1/2015
(Continued)

OTHER PUBLICATIONS

Machine translation, Han, Chinese Pat. Pub. No. CN-109950284-A, translation date: Feb. 23, 2023, Espacenet, all pages. (Year: 2023).*
(Continued)

*Primary Examiner* — Victoria K. Hall
(74) *Attorney, Agent, or Firm* — Chiwin Law LLC

(57) ABSTRACT

Provided are an array substrate and a manufacturing method therefor, a display device, and a mask plate. The array substrate includes a pixel defining layer having a first opening, a second opening, and a third opening passing through the pixel defining layer. Every two of the first to third openings are adjacent to each other. The pixel defining layer includes first to third opening denning portions. At least one of the ratio of the slope angle of a portion of the first opening defining portion located between the first opening and the second opening to the slope angle of the third opening defining portion, and the ratio of the slope angle of a portion of the second opening defining portion located between the first opening and the second opening to the slope angle of the third opening defining portion is from 0.8 to 1.25.

20 Claims, 10 Drawing Sheets

(51) Int. Cl.
*H10K 59/122* (2023.01)
*H10K 59/35* (2023.01)
*H10K 71/00* (2023.01)
*G03F 1/00* (2012.01)
*G03F 1/38* (2012.01)
*H10K 59/12* (2023.01)

(52) U.S. Cl.
CPC ......... *H10K 59/352* (2023.02); *H10K 59/353* (2023.02); *H10K 71/00* (2023.02); *H10K 59/1201* (2023.02)

(56) References Cited

U.S. PATENT DOCUMENTS

| | | | | |
|---|---|---|---|---|
| 11,017,722 | B1* | 5/2021 | Kong | H10K 59/351 |
| 11,462,589 | B2* | 10/2022 | Wang | H10K 59/353 |
| 11,462,591 | B2* | 10/2022 | Liu | H10K 59/126 |
| 2018/0366052 | A1* | 12/2018 | Shi | G09G 3/3275 |
| 2019/0140030 | A1* | 5/2019 | Huangfu | G09G 3/3225 |
| 2020/0035768 | A1* | 1/2020 | Okabe | H10K 59/122 |
| 2020/0168674 | A1* | 5/2020 | Tan | G02F 1/1333 |
| 2020/0168692 | A1* | 5/2020 | Liu | G09G 3/2986 |
| 2020/0312942 | A1* | 10/2020 | Yang | H10K 71/00 |
| 2020/0395418 | A1* | 12/2020 | Han | G02F 1/1337 |
| 2021/0193766 | A1* | 6/2021 | Liu | H10K 59/1213 |
| 2021/0305330 | A1* | 9/2021 | Xu | H10K 59/353 |
| 2021/0408181 | A1* | 12/2021 | Luo | H10K 59/352 |
| 2022/0005881 | A1* | 1/2022 | Ma | H10K 59/353 |
| 2022/0123074 | A1* | 4/2022 | Zhang | H10K 59/1315 |

FOREIGN PATENT DOCUMENTS

| | | | |
|---|---|---|---|
| CN | 107342039 A | | 11/2017 |
| CN | 208753326 U | | 4/2019 |
| CN | 109950284 A | * 6/2019 | ........... H10K 59/352 |
| WO | 2018179133 A1 | | 10/2018 |

OTHER PUBLICATIONS

Machine translation, Wang, Chinese Pat. Pub. No. CN-104281000-A, translation date: Jan. 28, 2023, Espacenet, all pages. (Year: 2023).*

International Searching Authority, Translation, Written Opinion of the International Searching Authority, International application No. PCT/CN2020/089118, dated Jul. 23, 2020, all pages. (Year: 2020).*

International Searching Authority, Translation, International Search Report, International application No. PCT/CN2020/089118, dated Jul. 23, 2020, all pages. (Year: 2020).*

\* cited by examiner

ARRAY SUBSTRATE AND MANUFACTURING METHOD THEREFOR, DISPLAY DEVICE, AND MASK PLATE

CROSS-REFERENCE TO RELATED APPLICATION

This application is a U.S. National Phase Entry of International Application No. PCT/CN2020/089118 filed on May 8, 2020, designating the United States of America and claiming priority to Chinese Patent Application No. 201910394681.7, filed on May 13, 2019. The present application claims priority to and the benefit of the above-identified applications and the above-identified applications are incorporated by reference herein in their entirety.

TECHNICAL FIELD

At least one embodiment of the present disclosure relates to an array substrate and a manufacturing method, a display device and a mask plate.

BACKGROUND

Display devices using organic light-emitting diode (OLED) display panels have a wide application prospect for having the advantages of simple manufacturing process, quick response speed, thin thickness, light weight, wide angle of view, active light emission, high brightness, continuous and adjustable light-emitting color, low power consumption, low cost, easiness for implementation of flexible display and the like.

SUMMARY

At least one embodiment of the present disclosure relates to an array substrate and a manufacturing method, a display device and a mask plate.

At least one embodiment of the present disclosure provides an array substrate, including a pixel defining layer (PDL), the PDL is provided with a first opening, a second opening, and a third opening that penetrate the PDL, and every two of the first opening, the second opening, and the third opening are adjacent to each other; a minimum distance between the first opening and the second opening is less than a minimum distance between the first opening and the third opening; the PDL includes a first opening defining portion, a second opening defining portion, and a third opening defining portion; the first opening defining portion is configured to define the first opening, the second opening defining portion is configured to define the second opening, and the third opening defining portion is configured to define the third opening; and at least one of a ratio of a slope angle of a part of the first opening defining portion located between the first opening and the second opening to a slope angle of the third opening defining portion and a ratio of a slope angle of a part of the second opening defining portion located between the first opening and the second opening to the slope angle of the third opening defining portion is in a range from 0.8 to 1.25.

According to the array substrate provided by one or more embodiments of the present disclosure, at least one of the ratio of the slope angle of the part of the first opening defining portion located between the first opening and the second opening to the slope angle of the third opening defining portion and the ratio of the slope angle of the part of the second opening defining portion located between the first opening and the second opening to the slope angle of the third opening defining portion is more than or equal to 1 and less than 1.2.

According to the array substrate provided by one or more embodiments of the present disclosure, at least one of the ratio of the slope angle of the part of the first opening defining portion located between the first opening and the second opening to the slope angle of the third opening defining portion and the ratio of the slope angle of the part of the second opening defining portion located between the first opening and the second opening to the slope angle of the third opening defining portion is more than or equal to 0.8 and less than or equal to 1.

According to the array substrate provided by one or more embodiments of the present disclosure, the slope angle of the part of the first opening defining portion located between the first opening and the second opening or the slope angle of the part of the second opening defining portion located between the first opening and the second opening is in a range from 28° to 35°.

According to the array substrate provided by one or more embodiments of the present disclosure, a ratio of a size of an orthographic projection of the part of the first opening defining portion located between the first opening and the second opening or the part of the second opening defining portion located between the first opening and the second opening on a base substrate to a size of an orthographic projection of a part of the PDL located between the first opening and the second opening on the base substrate is in a range from 0.10 to 0.25.

According to the array substrate provided by one or more embodiments of the present disclosure, the PDL is further provided with a fourth opening penetrating the PDL, every two of the fourth opening, the first opening, and the second opening are adjacent to each other, the PDL further includes a fourth opening defining portion, and the fourth opening defining portion is configured to define the fourth opening; the minimum distance between the first opening and the second opening is further less than a minimum distance between the first opening and the fourth opening; and the first opening and the second opening are located between the third opening and the fourth opening, and the first opening and the second opening are arranged at two sides of a line connecting a center of the third opening with a center of the fourth opening, respectively; and at least one of a ratio of the slope angle of the part of the first opening defining portion located between the first opening and the second opening to a slope angle of the fourth opening defining portion and a ratio of the slope angle of the part of the second opening defining portion located between the first opening and the second opening to the slope angle of the fourth opening defining portion is in a range from 0.8 to 1.25.

According to the array substrate provided by one or more embodiments of the present disclosure, the first opening, the second opening, the third opening, and the fourth opening define a light-emitting region of a first sub-pixel, a light-emitting region of a second sub-pixel, a light-emitting region of a third sub-pixel, and a light-emitting region of a fourth sub-pixel, respectively; the first sub-pixel, the third sub-pixel, and the fourth sub-pixel are sub-pixels of different colors; and the first sub-pixel and the second sub-pixel are sub-pixels of a same color.

According to the array substrate provided by one or more embodiments of the present disclosure, an area of the first opening is equal to an area of the second opening, the area of the first opening is less than an area of the fourth opening, and the area of the fourth opening is less than an area of the third opening.

According to the array substrate provided by one or more embodiments of the present disclosure, at least one of a side of the first opening close to the second opening and a side of the second opening close to the first opening is provided with a distance adjustment portion, and the distance adjustment portion is configured such that a distance between the first opening and the second opening in a direction parallel with the base substrate gradually changes in a direction intersecting with an arrangement direction of the first opening and the second opening.

According to the array substrate provided by one or more embodiments of the present disclosure, the distance adjustment portion is configured such that the distance between the first opening and the second opening in the direction parallel with the base substrate gradually decreases and then gradually increases in the direction intersecting with the arrangement direction of the first opening and the second opening.

According to the array substrate provided by one or more embodiments of the present disclosure, a distance between a side of the first opening close to the second opening and a side of the second opening close to the first opening in a direction parallel with the base substrate is a fixed value in the direction intersecting with an arrangement direction of the first opening and the second opening.

At least one embodiment of the present disclosure further provides a display device, including any one of the array substrates as described above.

At least one embodiment of the present disclosure further provides a mask plate, configured to manufacture a pixel defining layer (PDL) in an array substrate; the PDL is provided with a first opening, a second opening, and a third opening that penetrate the PDL, and every two of the first opening, the second opening, and the third opening are adjacent to each other; a minimum distance between the first opening and the second opening is less than a minimum distance between the first opening and the third opening; the PDL includes a first opening defining portion, a second opening defining portion, and a third opening defining portion; the first opening defining portion is configured to define the first opening, the second opening defining portion is configured to define the second opening, and the third opening defining portion is configured to define the third opening; and the mask plate includes: a pattern portion, including a first pattern, a second pattern, and a third pattern; the first pattern being configured to form the first opening, the second pattern being configured to form the second opening, and the third pattern being configured to form the third opening; and a filling portion, located in a region other than the pattern portion; one of the pattern portion and the filling portion is configured to transmit light, and the other of the pattern portion and the filling portion is configured to block light; at least one of a side of the first pattern close to the second pattern and a side of the second pattern close to the first pattern includes a protrusion; and the protrusion is configured such that at least one of a ratio of a slope angle of a part of the first opening defining portion located between the first opening and the second opening to a slope angle of the third opening defining portion and a ratio of a slope angle of a part of the second opening defining portion located between the first opening and the second opening to the slope angle of the third opening defining portion is in a range from 0.8 to 1.25.

According to the mask plate provided by one or more embodiments of the present disclosure, the protrusion is configured such that a distance between the first pattern and the second pattern gradually changes.

According to the mask plate provided by one or more embodiments of the present disclosure, the protrusion is of a triangle, and the distance between the first pattern and the second pattern gradually decreases and then gradually increases in a direction perpendicular to an arrangement direction of the first pattern and the second pattern.

According to the mask plate provided by one or more embodiments of the present disclosure, the protrusion and a part of the filling portion form an optical compensation portion, and the optical compensation portion is configured to transmit a part of light irradiated onto the optical compensation portion in a diffractive manner.

According to the mask plate provided by one or more embodiments of the present disclosure, the protrusion includes a plurality of sub-protrusions, and the plurality of sub-protrusions are sequentially arranged along an extension direction of each of a boundary of the first pattern and a boundary of the second pattern that are opposite to each other.

According to the mask plate provided by one or more embodiments of the present disclosure, a part of the filling portion is provided between adjacent ones of the plurality of sub-protrusions.

According to the mask plate provided by one or more embodiments of the present disclosure, each of the plurality of sub-protrusions has a size less than a resolution of an exposure machine.

According to the mask plate provided by one or more embodiments of the present disclosure, each of the plurality of sub-protrusions includes at least one of a triangle and a rectangle, at least one of a bottom length and a height of the triangle is less than or equal to 1.5 μm, and at least one of a length and a width of the rectangle is less than or equal to 1.5 μm.

According to the mask plate provided by one or more embodiments of the present disclosure, the PDL is further provided with a fourth opening penetrating the PDL, the PDL further includes a fourth pixel defining portion configured to define the fourth opening, the pattern portion further includes a fourth pattern, and the fourth pattern is configured to form the fourth opening; a minimum distance between the first pattern and the second pattern is less than a minimum distance between the first pattern and the third pattern, and less than a minimum distance between the first pattern and the fourth pattern; the first pattern and the second pattern are located between the third pattern and the fourth pattern and arranged at two sides of a line connecting a center of the third pattern with a center of the fourth pattern, respectively; and the protrusion is further configured such that at least one of a ratio of the slope angle of the part of the first opening defining portion located between the first opening and the second opening to a slope angle of the fourth opening defining portion and a ratio of the slope angle of the part of the second opening defining portion located between the first opening and the second opening to the slope angle of the fourth opening defining portion is in a range from 0.8 to 1.25.

At least one embodiment of the present disclosure further provides a manufacturing method of an array substrate, including manufacturing a pixel defining layer (PDL) with any one of the mask plates as described above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not construed as any limitation to the present disclosure.

DETAILED DESCRIPTION

In order to make objectives, technical details and advantages of the embodiments of the present disclosure more clear, the technical solutions of the embodiments will be described in a clearly and fully understandable way in connection with the drawings related to the embodiments of the present disclosure. Obviously, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

Figure 1A:
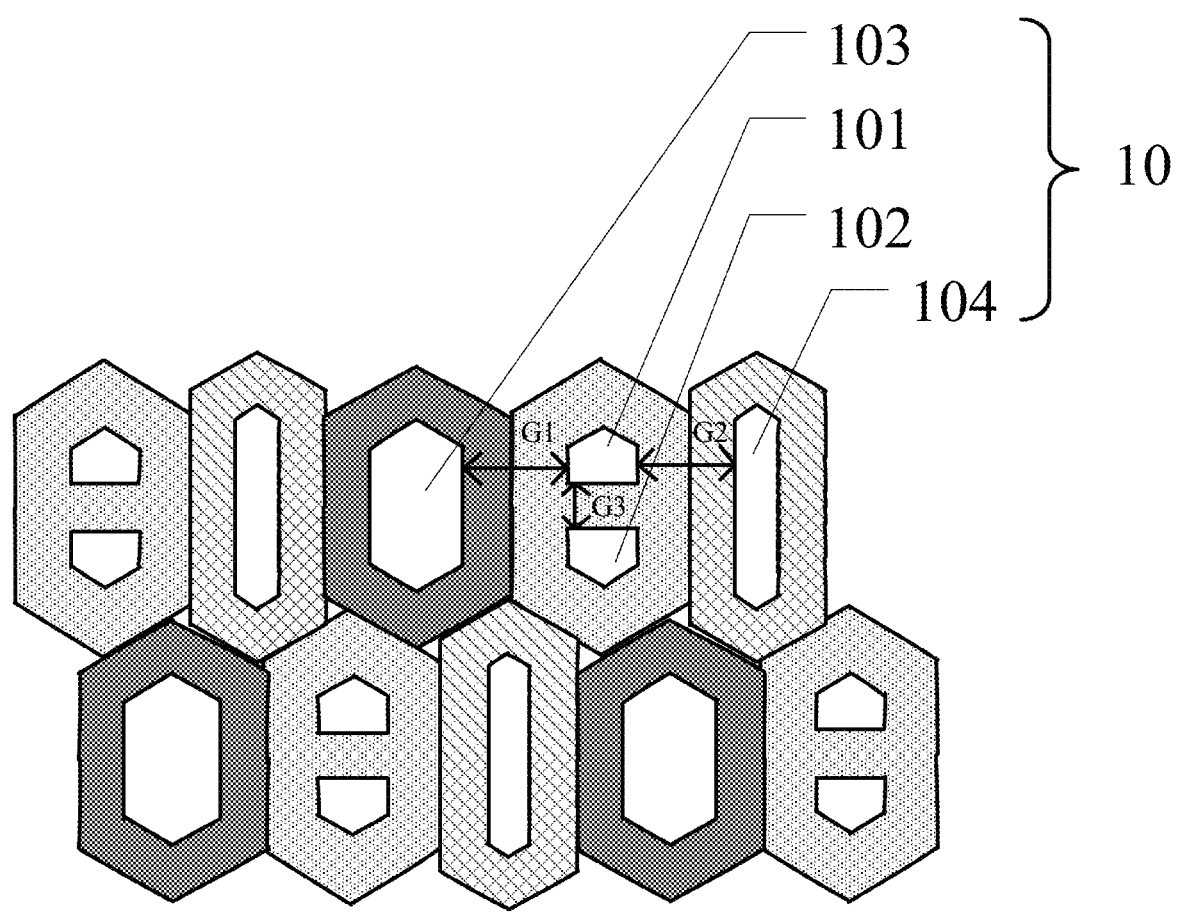
FIG. 1A is a schematic diagram of a pixel arrangement.

FIG. 1A is a schematic diagram of a pixel arrangement. As illustrated in FIG. 1A, a pixel group 10 includes a first sub-pixel 101, a second sub-pixel 102, a third sub-pixel 103, and a fourth sub-pixel 104. The pixel defining layer (PDL) defines a light-emitting region of each sub-pixel. In FIG. 1A, a blank region within each hexagon serves as an opening of the PDL, and each opening corresponds to the light-emitting region of one sub-pixel. In light of the color mixing problem, the spacing between PDL openings of sub-pixels of different colors are typically required to be more than or equal to 20 µm.

Figure 1B:
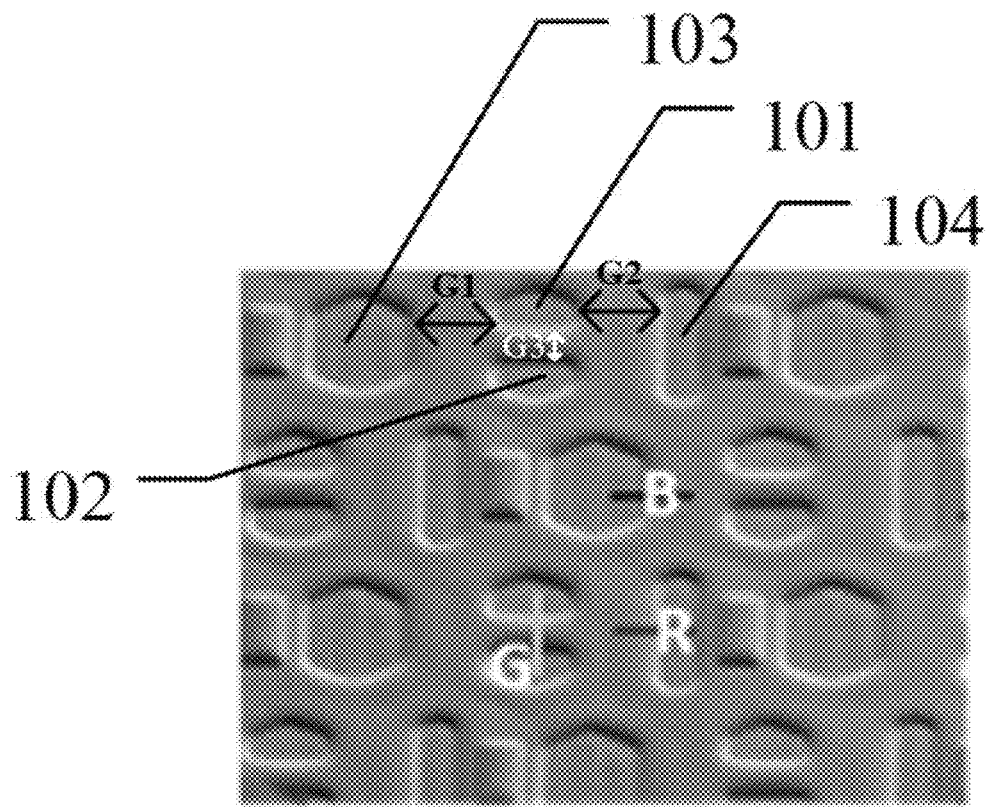
FIG. 1B is a planar scanning electron microscope diagram of a Green Green Red Blue (GGRB) pixel arrangement.

FIG. 1B is a planar scanning electron microscope diagram of a GGRB pixel arrangement. In the case where the first sub-pixel 101 and the second sub-pixel 102 are green sub-pixels, the third sub-pixel 103 is a blue sub-pixel, and the fourth sub-pixel 104 is a red sub-pixel, the pixel arrangement is the GGRB pixel arrangement. With the GGRB pixel arrangement as an example, the spacing G1 between PDL openings of the blue sub-pixel and the green sub-pixel is ≥20 µm, and the spacing G2 between PDL openings of the red sub-pixel and the green sub-pixel is ≥20 µm. Because the first sub-pixel 101 and the second sub-pixel 102 are sub-pixels of the same color, the spacing G3 between PDL openings of the first sub-pixel 101 and the second sub-pixel 102 is smaller, and typically is about 15 µm. Due to the smaller spacing G3 between the PDL openings of the first sub-pixel 101 and the second sub-pixel 102, the slope angle/taper angle of a portion of the PDL for forming the light-emitting region of the green sub-pixel and located between adjacent green sub-pixels is larger than the slope angle of a portion of the PDL for forming the light-emitting region of the red and/or green sub-pixel during the process.

Figure 1C:
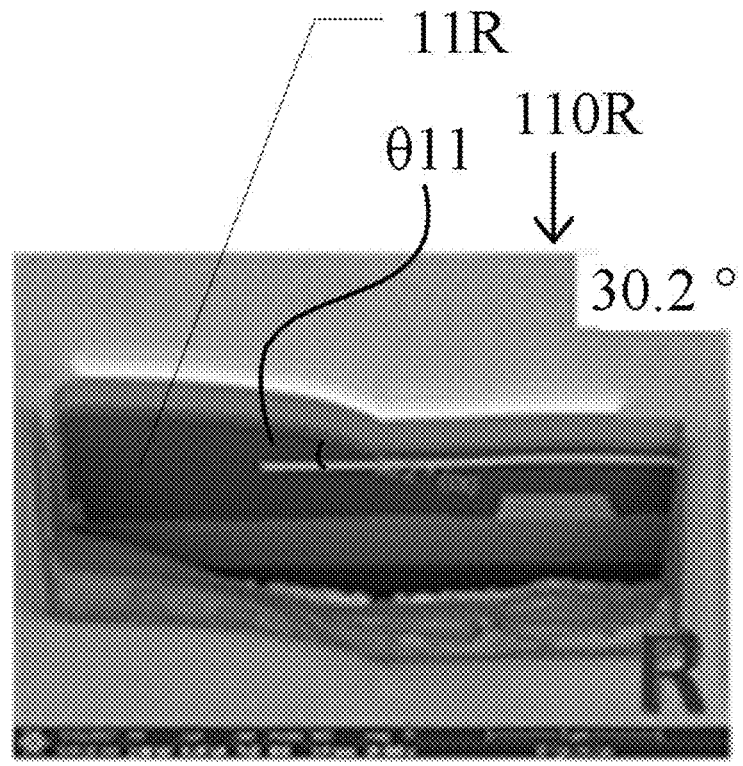
FIG. 1C is a sectional scanning electron microscope diagram of a portion, forming a light-emitting region of a red sub-pixel R, of a PDL in a conventional art.

FIG. 1C is a sectional scanning electron microscope diagram of a portion, forming a light-emitting region of a red sub-pixel R, of a PDL in a conventional art. For example, the portion 11R of the PDL for forming the light-emitting region of the red sub-pixel R has a slope angle θ11 of about 30.2°. FIG. 1C further illustrates an opening 110R of the PDL. For example, the portion of the PDL for forming the light-emitting region of the blue sub-pixel B also has a slope angle of about 30.2°.

Figure 1D:
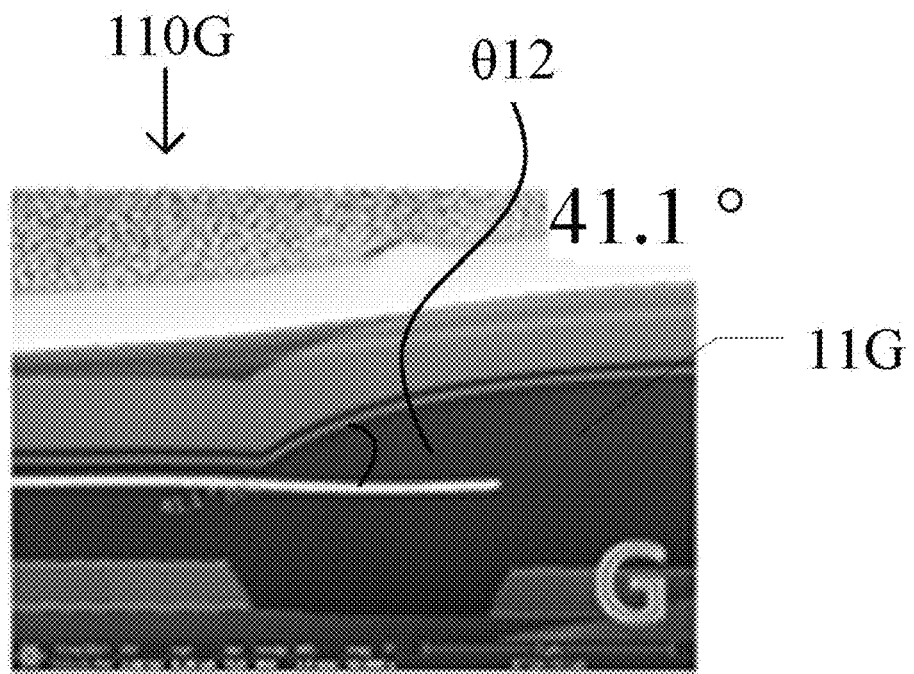
FIG. 1D is a sectional scanning electron microscope diagram of a portion, forming a light-emitting region of a green sub-pixel G, of a PDL in a conventional art.

FIG. 1D is a sectional scanning electron microscope diagram of a portion, forming a light-emitting region of a green sub-pixel G, of a PDL in a conventional art. For example, the portion 11G of the PDL for forming the light-emitting region of the green sub-pixel G has a slope angle θ12 of about 41.1°. FIG. 1D further illustrates an opening 110G of the PDL.

Typically, the process for manufacturing the PDL includes exposing a pixel defining thin film with a mask plate, developing the pixel defining thin film with a developing solution, and pre-baking the pixel defining thin film. The pixel defining thin film may use resin like a photoresist (PR) as a formation material. The large slope angle of the portion of the PDL for forming the light-emitting region of the green sub-pixel and located between the adjacent green sub-pixels may be attributed to at least one of the followings: (1) during the developing process, the flowability of the developing solution at the green sub-pixel is less than that of the developing solution at the sub-pixels of other colors; and (2) during the pre-baking process of the PR as the formation material of the PDL, as the space between two adjacent green sub-pixels is smaller, the flow state of the portion of the PDL that is located between the two green sub-pixels is different from that of the portions of the PDL that is located in other regions. The large slope angle of the portion of the PDL that is located between the adjacent green sub-pixels easily results in that the connection of the cathode at the green sub-pixel is poor, the light reflecting direction of the green sub-pixel is different from that of the red and/or blue sub-pixel, and the organic film for packaging, such as an organic film formed by ink-jet printing (IJP), is abnormal at the green sub-pixel to cause problem of the organic film mura and other problems.

Figure 1E:
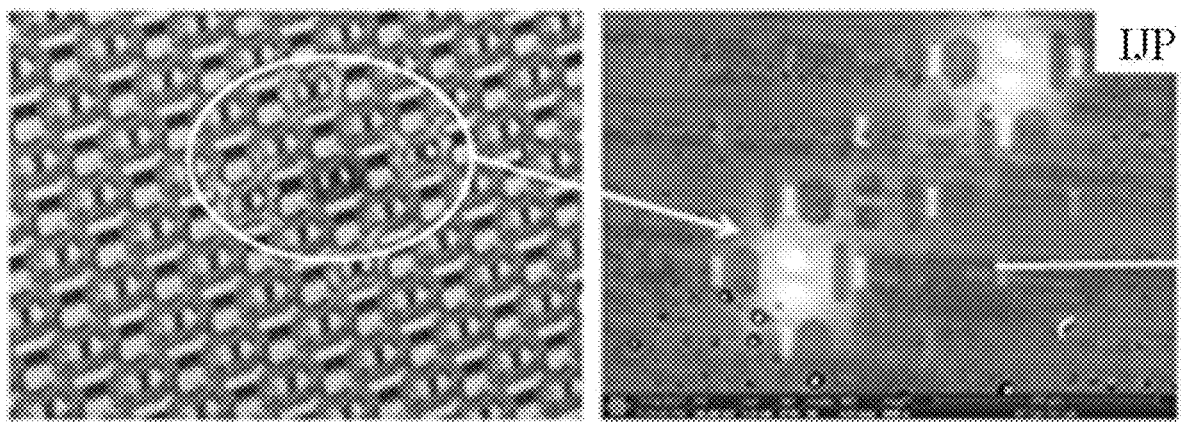
FIG. 1E is a microscope diagram of a defect of a display device due to a difference in slope angle.

FIG. 1E is a microscope diagram of a defect of a display device due to a difference in slope angle. FIG. 1E illustrates that the large slope angle of the portion of the PDL that is located between the green sub-pixels results in that the light outgoing direction of the green sub-pixel is different from that of the red and/or blue sub-pixel, and the organic film for packaging is abnormal at the green sub-pixel to cause problem of the organic film mura.

The embodiments of the present disclosure provide an array substrate, which can reduce the slope angles of portions of the PDL for forming close sub-pixels, and reduce the difference between the slope angles of portions of the PDL for forming sub-pixels of different colors.

Figure 2A:
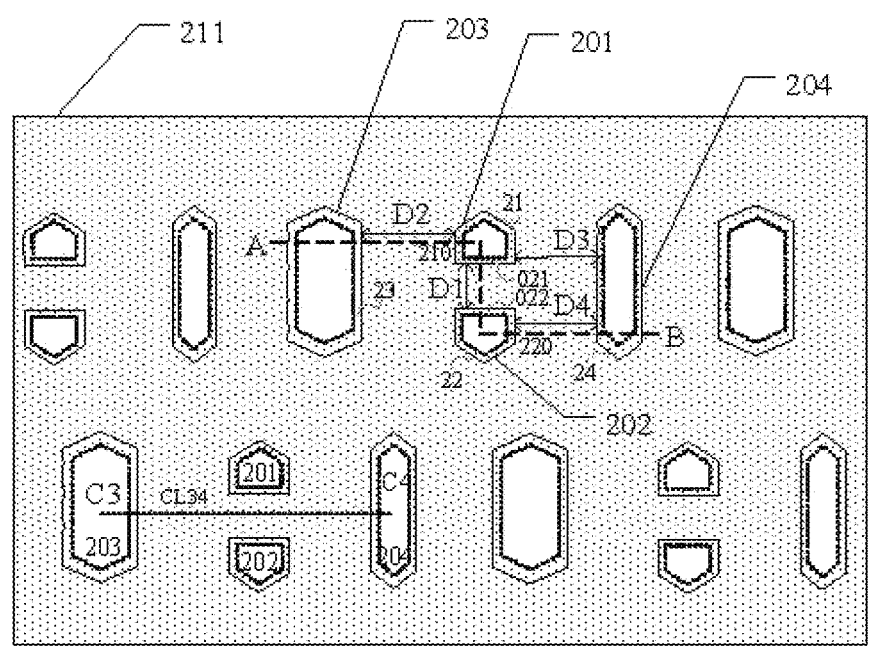
FIG. 2A is a top view of an array substrate provided by an embodiment of the present disclosure.

FIG. 2A is a top view of an array substrate provided by an embodiment of the present disclosure. The array substrate includes: a PDL 211. The PDL 211 is provided with a first opening 201, a second opening 202, and a third opening 203 that penetrate the PDL, and every two of the first opening 201, the second opening 202, and the third opening 203 are adjacent to each other. A minimum distance D1 between the first opening 201 and the second opening 202 is less than a minimum distance D2 between the first opening 201 and the third opening 203. For the sake of clear illustration, FIG. 2A merely illustrates the PDL 211 and the openings penetrating the PDL 211, and does not illustrate other structures.

For example, as illustrated in FIG. 2A, a distance D1 between a side of the first opening 201 close to the second opening 202 and a side of the second opening 202 close to the first opening 201 in a direction parallel with a base substrate 2001 is a fixed value in a direction intersecting with an arrangement direction of the first opening 201 and the second opening 202, which is not limited thereto.

Figure 2B:
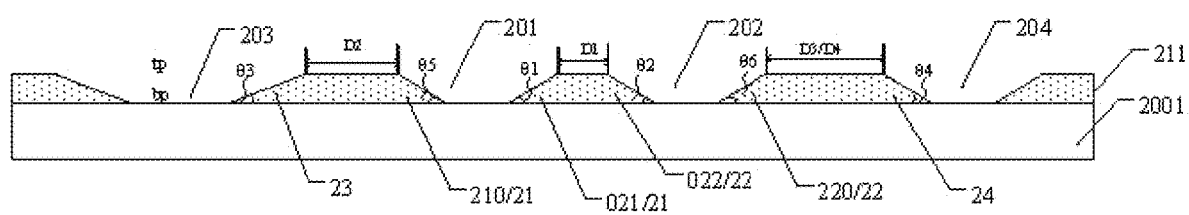
FIG. 2B is a sectional view of an array substrate illustrated in FIG. 2A along line A-B.

FIG. 2B is a sectional view of an array substrate illustrated in FIG. 2A along line A-B. As illustrated in FIG. 2A and FIG. 2B, the PDL includes a first pixel defining portion 21, a second pixel defining portion 22, and a third pixel defining portion 23; the first pixel defining portion 21 is configured to define the first opening 201, the second pixel defining portion 22 is configured to define the second opening 202, and the third pixel defining portion 23 is configured to define the third opening 203. A ratio of a slope angle of a portion 021 of the first pixel defining portion 21 that is located between the first opening 201 and the second opening 202 to a slope angle of the third pixel defining portion 23 and/or a ratio of a slope angle of a portion 022 of the second pixel defining portion 22 that is located between the first opening 201 and the second opening 202 to the slope angle of the third pixel defining portion 23 are/is in a range from 0.8 to 1.25. According to the embodiment of the present disclosure, the slope angle of the portion 021 of the first pixel defining portion 21 that is located between the first opening 201 and the second opening 202 may be equal or close to the slope angle of the third pixel defining portion 23, and the slope angle of the portion 022 of the second pixel defining portion 22 that is located between the first opening 201 and the second opening 202 may be equal or close to the slope angle of the third pixel defining portion 23, thereby preventing the problems due to the large slope angle of the portion 021 of the first pixel defining portion 21 that is located between the first opening 201 and the second opening 202 or the large slope angle of the portion 022 of the second pixel defining portion 22 that is located between the first opening 201 and the second opening 202. For the sake of clear illustration, FIG. 2A merely illustrates the base substrate 2001, the PDL 211 and the openings penetrating the PDL 211, and does not illustrate other structures.

As illustrated in FIG. 2A and FIG. 2B, each opening includes a bottom portion bp and a top portion tp, and the bottom portion bp is closer to the base substrate than the top portion tp. An area of the bottom portion bp of the opening is less than an area of the top portion tp of the opening. In FIG. 2A, the closed dashed box refers to the bottom portion of the opening, and the closed solid box refers to the top portion of the opening. The portion of the PDL which is between the bottom portion bp and the top portion tp of each opening and defines the boundary of the opening is the pixel defining portion. The opening includes any one of the first opening 201, the second opening 202, the third opening 203, and the subsequently mentioned fourth opening 204. The pixel defining portion includes any one of the first pixel defining portion 21, the second pixel defining portion 22, the third pixel defining portion 23, and the subsequently mentioned fourth pixel defining portion 24. For example, the distance between the openings is a distance between opposite edges of top portions of the openings. For example, the embodiment of the present disclosure takes a case where the top portion tp of the opening corresponds to the light-emitting region of the sub-pixel as an example for description, which is not limited thereto.

For example, as illustrated in FIG. 2A and FIG. 2B, in the embodiment of the present disclosure, a ratio of the slope angle of the portion 021 of the first pixel defining portion 21 that is located between the first opening 201 and the second opening 202 to a slope angle of a portion of the first pixel defining portion 21 that is located in a region other than the region between the first opening 201 and the second opening 202 is in a range from 0.8 to 1.25, which is not limited thereto. For example, as illustrated in FIG. 2A and FIG. 2B, a ratio of the slope angle of the portion 022 of the second pixel defining portion 22 that is located between the first opening 201 and the second opening 202 to a slope angle of a portion of the second pixel defining portion 22 that is located in a region other than the region between the first opening 201 and the second opening 202 is in a range from 0.8 to 1.25, which is not limited thereto. For example, the slope angles of the third pixel defining portion 23 at various positions are equal or basically equal, which are not limited thereto.

For example, in other embodiments of the present disclosure, the ratio of the slope angle of the portion 021 of the first pixel defining portion 21 that is located between the first opening 201 and the second opening 202 to the slope angle of the portion, located in a region other than the region between the first opening 201 and the second opening 202, of the first pixel defining portion 21 is more than or equal to 0.8 and less than or equal to 1. For example, in other embodiments of the present disclosure, the ratio of the slope angle of the portion 022 of the second pixel defining portion 22 that is located between the first opening 201 and the second opening 202 to the slope angle of the portion of the second pixel defining portion 22 that is located in a region other than the region between the first opening 201 and the second opening 202 is more than or equal to 0.8 and less than or equal to 1.

For example, in the embodiment of the present disclosure, the slope angle refers to an included angle between the pixel defining portion (the portion forming the opening) of the PDL and the base substrate, or, the slope angle refers to an included angle between a surface of the pixel defining portion of the PDL and a surface of the base substrate. The surface of the pixel defining portion of the PDL includes an inclined surface, a curved surface, etc. In a case where the surface of the pixel defining portion of the PDL is the curved surface, the slope angle may refer to a maximum included angle between a tangent line of the surface of the pixel defining portion of the PDL and the surface of the base substrate, or an included angle between a tangent line of a middle portion (a surface at a half of the height of the pixel defining portion) of the surface of the pixel defining portion and the surface of the base substrate, which is not limited thereto.

For example, the embodiment of the present disclosure takes a case where the portion of the PDL (that is, a planarization portion of the PDL that is located between the two openings) that is located between two openings and other than the portion forming the two openings has a thickness of about 1.5-2 μm as an example, which is not limited thereto. For example, an orthographic projection of the portion 021 of the first pixel defining portion 21 that is located between the first opening 201 and the second opening 202 or the portion 022 of the second pixel defining portion 22 that is located between the first opening 201 and the second opening 202 on the base substrate has a size of 2 μm to 3.5 which is not limited thereto. For example, a ratio of the size of the orthographic projection of the portion 021 of the first pixel defining portion 21 that is located between the first opening 201 and the second opening 202 or the portion 022 of the second pixel defining portion 22 that is located between the first opening 201 and the second opening 202 on the base substrate to a size of an orthographic projection of a portion of the PDL that is located between the first opening 201 and the second opening 202 is in a range from 0.10 to 0.25, which is not limited thereto. For example, as illustrated in FIG. 2B, the D1 is about 15 μm, and each of the D2, the D3 and the D4 is about 20 μm which is not limited thereto.

The array substrate provided by the embodiment of the present disclosure can reduce the slope angle of the portion of the pixel defining portion that is located between the close sub-pixels, can reduce the difference between the slope angles of the pixel defining portions that form the sub-pixels of different colors, and can improve various problems caused by the large slope angle of the portion of the pixel defining portion that is located between the close sub-pixels.

For example, the close sub-pixels may be sub-pixels that emit the light of the same color, so the same through hole of the mask plate may be used to manufacture light-emitting functional layers of the close sub-pixels, which is not limited thereto. The close sub-pixels may also be sub-pixels that emit the light of different colors.

According to the array substrate provided by one or more embodiments of the present disclosure, the ratio of the slope angle of the portion 021 of the first pixel defining portion 21 that is located between the first opening 201 and the second opening 202 to the slope angle of the third pixel defining portion 23 is more than or equal to 1 and less than 1.2, and/or, the ratio of the slope angle of the portion 022 of the second pixel defining portion 22 that is located between the first opening 201 and the second opening 202 to the slope angle of the third pixel defining portion 23 is more than or equal to 1 and less than 1.2.

For example, the slope angle of the portion 021 of the first pixel defining portion 21 that is located between the first opening 201 and the second opening 202 or the slope angle of the portion 022 of the second pixel defining portion 22 that is located between the first opening 201 and the second opening 202 is about in a range from 28° to 35°.

As illustrated in FIG. 2A and FIG. 2B, according to the array substrate provided by one or more embodiments of the present disclosure, the PDL 211 is further provided with a fourth opening 204 penetrating the PDL 211, every two of the fourth opening 204, the first opening 201, and the second opening 202 are adjacent to each other, and the minimum distance D1 between the first opening 201 and the second opening 202 is further less than a minimum distance D3 between the first opening 201 and the fourth opening 204; and the first opening 201 and the second opening 202 are located between the third opening 203 and the fourth opening 204, and the first opening 201 and the second opening 202 are arranged at two sides of a line CL34 connecting a center C3 of the third opening 203 with a center C4 of the fourth opening 204, respectively. Correspondingly, the PDL 211 further includes a fourth pixel defining portion 24, and the fourth pixel defining portion 24 is configured to define the fourth opening 204. A ratio of the slope angle of the portion 021 of the first pixel defining portion 21 that is located between the first opening 201 and the second opening 202 to a slope angle of the fourth pixel defining portion 24 is in a range from 0.8 to 1.25, and/or, a ratio of the slope angle of the portion 022 of the second pixel defining portion 22 that is located between the first opening 201 and the second opening 202 to the slope angle of the fourth pixel defining portion 24 is in a range from 0.8 to 1.25. Further, for example, the ratio is more than or equal to 1 and less than 1.2, which is not limited thereto. For example, as illustrated in FIG. 2A, the minimum distance between the second opening 202 and the fourth opening 204 is D4. For example, D3=D4, which is not limited thereto. For example, the slope angles of the fourth pixel defining portion 24 at various positions are equal or basically equal, which are not limited thereto.

For example, as illustrated in FIG. 2A and FIG. 2B, there is a little difference in the slope angle of the fourth pixel defining portion 24 at various positions.

For example, as illustrated in FIG. 2A and FIG. 2B, the embodiment of the present disclosure takes a case where the slope angle of the third pixel defining portion 23 or the slope angle of the fourth defining portion 24 is about in a range from 28° to 35° as an example, which is not limited thereto. For example, the slope angle of the third pixel defining portion 23 or the slope angle of the fourth defining portion 24 is about 30°, which is not limited thereto.

For example, in the embodiment of the present disclosure, the expression of "adjacent first element and second element" refers to that neither the first element nor the second element is arranged between the first element and the second element. In the case where the first element and the second element are the same elements, another same element is not arranged between the two same elements. For example, another element different from the first element and the second element may be arranged between the adjacent first element and second element. For example, the expression of "the adjacent first opening 201 and second opening 202" refers to that neither the first opening 201 nor the second opening 202 is arranged between the first opening 201 and the second opening 202.

For example, as illustrated in FIG. 2A and FIG. 2B, the portion 021 of the first pixel defining portion 21 that is located between the first opening 201 and the second opening 202, the portion 022 of the second pixel defining portion 22 that is located between the first opening 201 and the second opening 202, the third opening defining portion 23, and the fourth pixel defining portion 24 are of an integral structure. For example, as illustrated in FIG. 2A and FIG. 2B, portions other than pentagonal blank regions and hexagonal blank regions in FIG. 2A are all of an integral structure.

For example, as illustrated in FIG. 2A and FIG. 2B, the slope angle θ5 of the portion 210 of the first pixel defining portion 21 that is located in a region other than a region between opposite positions of the first opening 201 and the second opening 202 is approximately equal to the slope angle θ3, which is not limited thereto. For example, the ratio of the slope angle θ1 to the slope angle θ5 is in a range from 0.8 to 1.25. Further, for example, the ratio of the slope angle θ1 to the slope angle θ5 is more than or equal to 1 and less than 1.2.

For example, as illustrated in FIG. 2A and FIG. 2B, the slope angle θ6 of the portion 220 of the second pixel defining portion 22 that is located in a region other than a region between opposite positions of the first opening 201 and the second opening 202 is approximately equal to the slope angle θ4, which is not limited thereto. For example, the ratio of the slope angle θ2 to the slope angle θ6 is in a range from 0.8 to 1.25. Further, for example, the ratio of the slope angle θ2 to the slope angle θ6 is more than or equal to 1 and less than 1.2.

For example, the slope angle θ5 is equal to the slope angle θ6, which is not limited thereto. For example, the slope angle θ3 is equal to the slope angle θ4, which is not limited thereto. For example, the slope angle θ5 is equal to the slope angle θ3, which is not limited thereto. For example, the slope angle θ6 is equal to the slope angle θ4, which is not limited thereto.

For example, as illustrated in FIG. 2A and FIG. 2B, an area of the first opening 201 is less than an area of the fourth opening 204, and the area of the fourth opening 204 is less than an area of the third opening 203. For example, the area of the third opening 203 is more than a sum of the area of the first opening 201 and the area of the second opening 202, and the sum of the area of the first opening 201 and the area of the second opening 202 is more than the area of the fourth opening 204. For example, in other embodiments, the sum of the area of the first opening 201 and the area of the second opening 202 is more than the area of the third opening 203, and the area of the third opening 203 is more than the area of the fourth opening 204. For example, the area of the first opening 201 is equal to the area of the second opening 202, which is not limited thereto.

For example, as illustrated in FIG. 2A and FIG. 2B, the PDL 211 is located on the base substrate 2001, an area of an orthographic projection of at least one of the first opening 201 and the second opening 202 on the base substrate 2001 is less than an area of an orthographic projection of the fourth opening 204 on the base substrate 2001, and the area of the orthographic projection of the fourth opening 204 on the base substrate 2001 is less than an area of an orthographic projection of the third opening 203 on the base substrate 2001, which is not limited thereto. For example, the area of the orthographic projection of the third opening 203 on the base substrate 2001 is more than a sum of the areas of the orthographic projections of the first opening 201 and the second opening 202 on the base substrate 2001, and the sum of the areas of the orthographic projections of the first opening 201 and the second opening 202 on the base substrate 2001 is more than the area of the orthographic projection of the fourth opening 204 on the base substrate 2001, which is not limited thereto. In other embodiments, the sum of the areas of the orthographic projections of the first opening 201 and the second opening 202 on the base substrate 2001 is more than the area of the orthographic projection of the third opening 203 on the base substrate 2001, and the area of the orthographic projection of the third opening 203 on the base substrate 2001 is more than the area of the orthographic projection of the fourth opening 204 on the base substrate 2001.

The array substrate provided by the embodiment illustrated in FIG. 2B takes a case where the surface of the pixel defining portion (the surface of the PDL for forming the opening) is an inclined surface as an example for description, which is not limited thereto. In the actual process, the formed pixel defining portion may be provided with a surface of another shape such as a curved surface. The pixel defining portion includes at least one of the first pixel defining portion, the second pixel defining portion, the third pixel defining portion, and the fourth pixel defining portion. The opening includes at least one of the first opening, the second opening, the third opening, and the fourth opening.

The array substrate provided by the embodiment illustrated in FIG. 2B takes a case where both the slope angle of the portion 021 of the first pixel defining portion 21 that is located between the first opening 201 and the second opening 202 and the slope angle of the portion 022 of the second pixel defining portion 22 that is located between the first opening 201 and the second opening 202 are reduced to be equal or approximately equal to the slope angle θ3 or the slope angle θ4 as an example for description. In other embodiments, either the slope angle of the portion 021 of the first pixel defining portion 21 that is located between the first opening 201 and the second opening 202 or the slope angle of the portion 022 of the second pixel defining portion 22 that is located between the first opening 201 and the second opening 202 may be reduced to be equal or approximately equal to the slope angle θ3 or the slope angle θ4.

Figure 3A:
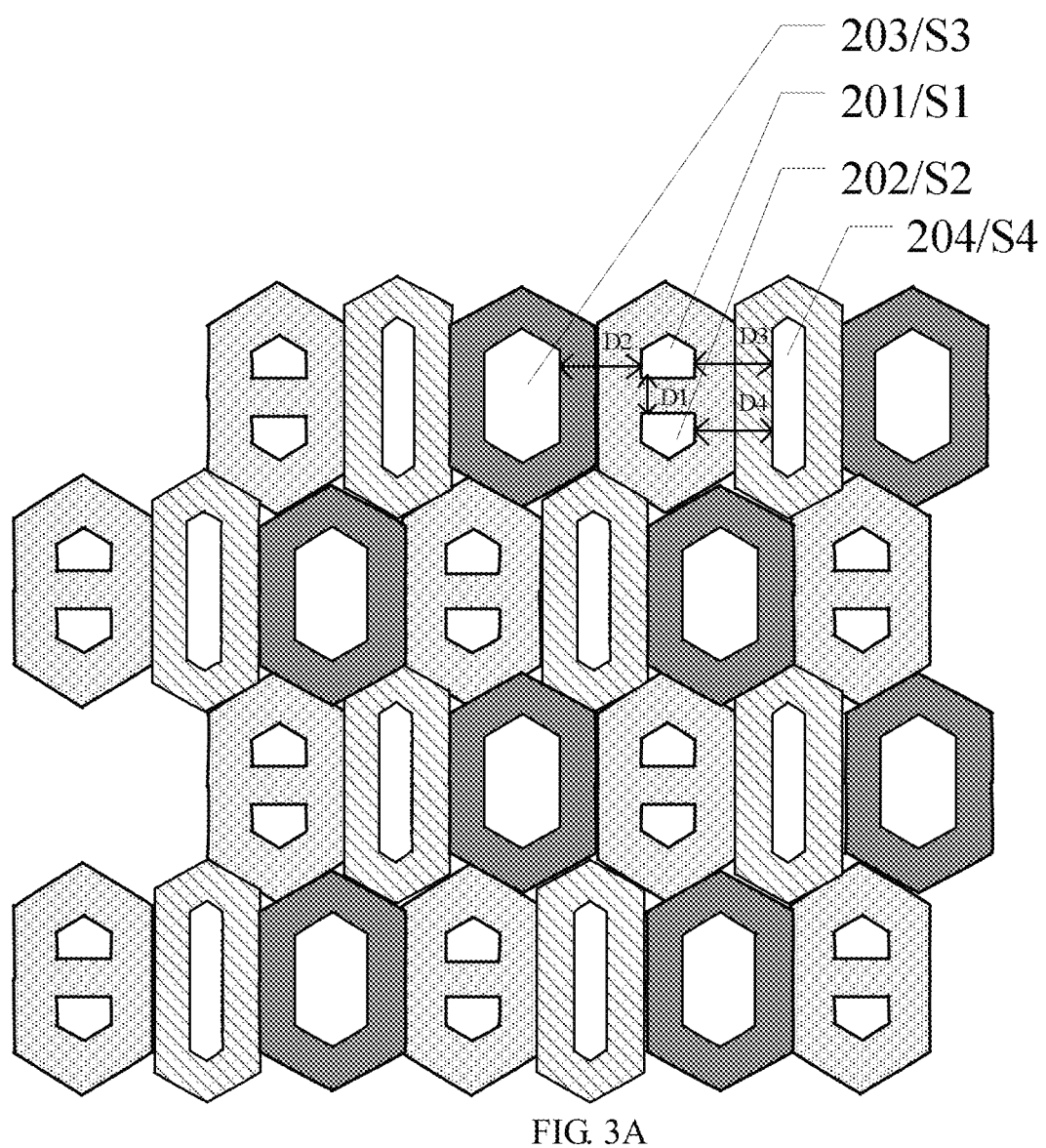
FIG. 3A is a schematic diagram of a pixel arrangement of an array substrate provided by an embodiment of the present disclosure.

FIG. 3A is a schematic diagram of a pixel arrangement of an array substrate provided by an embodiment of the present disclosure. As illustrated in FIG. 3A, the first opening 201, the second opening 202, the third opening 203, and the fourth opening 204 define a light-emitting region of the first sub-pixel S1, a light-emitting region of the second sub-pixel S2, a light-emitting region of the third sub-pixel S3, and a light-emitting region of the fourth sub-pixel S4, respectively. The first sub-pixel S1, the third sub-pixel S3, and the fourth sub-pixel S4 are sub-pixels of different colors, and the first sub-pixel S1 and the second sub-pixel S2 are sub-pixels of the same color. For example, the first sub-pixel S1 is a green sub-pixel, the third sub-pixel S3 is a blue sub-pixel, and the fourth sub-pixel S4 is a red sub-pixel. For example, as illustrated in FIG. 3A, the embodiment takes a case where the first opening 201 and the second opening 202 are of a pentagon and the third opening 203 and the fourth opening 204 are of a hexagon as an example for description, which is not limited thereto. The shapes of the first opening 201, the second opening 202, the third opening 203, and the fourth opening 204 may be determined as required. For example, referring to FIG. 3A and FIG. 2B, FIG. 3A takes a case where the opening refers to a top portion tp of the opening as an example, which is not limited thereto.

For example, in the embodiment of the present disclosure, the sub-pixel may be a minimum unit capable of being independently controlled for light outgoing. In the case where the display device is an OLED display device, the sub-pixel may include an OLED and a control element for controlling the OLED to emit light. In the case where the display device is a liquid crystal display device, the sub-pixel may include a pixel electrode, a liquid crystal layer, a common electrode, and a control element for controlling rotation of liquid crystal molecules in the liquid crystal layer. The control element includes a thin film transistor (TFT) and the like. The sub-pixel includes at least one of the first sub-pixel S1, the second sub-pixel S2, the third sub-pixel S3, and the fourth sub-pixel S4.

Figure 3B:
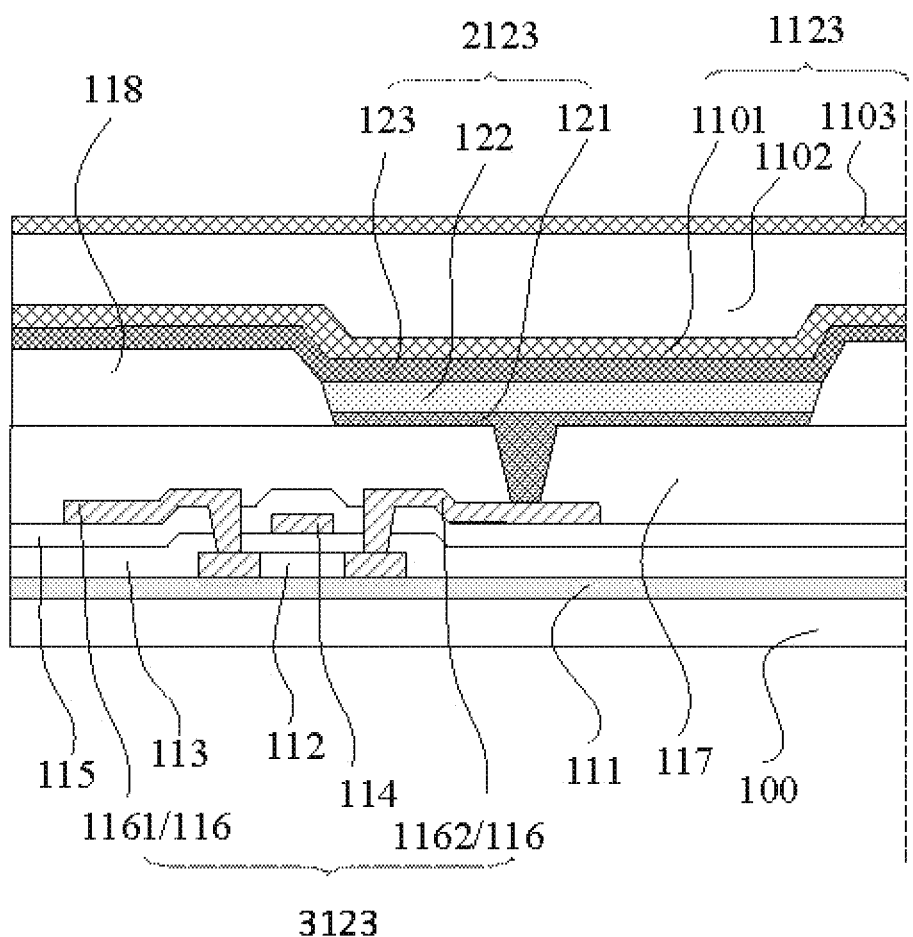
FIG. 3B is a sectional view of an array substrate provided by an embodiment of the present disclosure.

FIG. 3B is a sectional view of an array substrate provided by an embodiment of the present disclosure. As illustrated in FIG. 3B, a TFT 3123 array may be disposed on the base substrate 100. FIG. 3B merely illustrates one TFT 3123. The base substrate 100 may be a flexible substrate such as a polyimide (PI) substrate, which is not limited thereto. The TFT 3123 may include an active layer, a gate electrode, a gate insulation layer, a source electrode, a drain electrode and the like. As illustrated in FIG. 3B, a buffer layer 111, an active layer 112, a gate insulation layer 113, a gate electrode 114, an interlayer dielectric layer 115 and a source-drain layer 116 may be sequentially arranged on the base substrate 100, the source-drain layer 116 includes a source electrode 1161 and a drain electrode 1162, and the source electrode 1161 and the drain electrode 1162 are spaced apart from each other and may be connected to the active layer 112 through via hole, respectively. The portion of the active layer 112 connected to the source electrode 1161 is a source portion, and the portion of the active layer 112 connected to the drain electrode 1162 is a drain portion, for example, the portion between the source portion and the drain portion is a semiconductor, and both the source portion and the drain portion are a conductor. For example, the material of the semiconductor includes polycrystalline silicon, and the portion between the source portion and the drain portion includes a conductor converted from a polycrystalline silicon such as heavily-doped polycrystalline silicon. A planarization layer 117 may be disposed on the TFT 3123, a component to-be-encapsulated 2123 may be disposed on the planarization layer 117, and the component to-be-encapsulated may be an OLED. The component to-be-encapsulated 2123 may include a first electrode 121, a light-emitting functional layer 122, and a second electrode 123; and the first electrode 121 may be electrically connected to the drain electrode 1162 through a via hole penetrating the planarization layer 117. A PDL 118 may be disposed on the first electrode 121. The PDL 118 is provided with an opening penetrating the PDL 118. The light-emitting functional layer 122 may include a light-emitting layer, and may further include other functional layers such as at least one of a hole injection layer, a hole transport layer, an electron transport layer, and an electron injection layer, which is not limited thereto. An encapsulation thin film 1123 may be formed on the component to-be-encapsulated 2123. The encapsulation thin film 1123 includes a first thin film 1101, a second thin film 1102, and a third thin film 1103 that are sequentially away from the base substrate 100, and the second thin film 1102 is disposed between the first thin film 1101 and the third thin film 1103. The encapsulation thin film 1123 covers the component to-be-encapsulated 2123. For example, the first thin film 1011 and the third thin film 1003 may be inorganic thin films such as SiNx, SiOx, SiCxNy and other inorganic oxides, which are not limited thereto. For example, the second thin film 102 may be an organic thin film such as resin and other organic substances, which is not limited thereto.

For example, the PDL 211 in the array substrate provided by the embodiment of the present disclosure may be the PDL 118 illustrated in FIG. 3B, which is not limited thereto. The array substrate provided by the embodiment may alleviate or prevent the problem of mura of the second thin film 1102 in the encapsulation thin film.

Figure 4A:
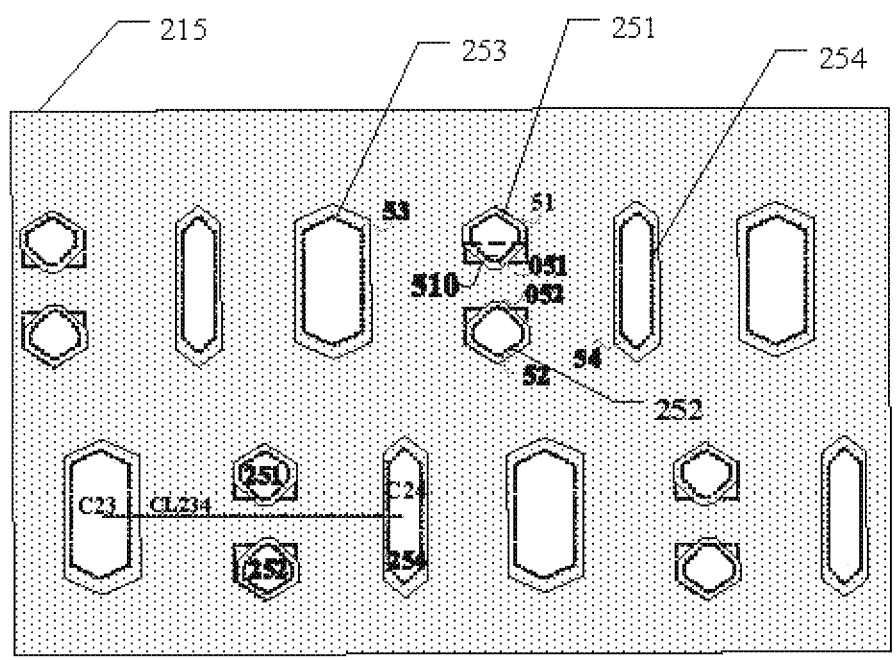
FIG. 4A is a top view of an array substrate provided by another embodiment of the present disclosure.

FIG. 4A is a top view of an array substrate provided by another embodiment of the present disclosure. The array substrate illustrated in FIG. 4A includes a PDL 215. Compared the PDL 215 with the PDL 211 illustrated in FIG. 2A, the differences lie in that the PDL 215 includes a first opening 251 and a second opening 252, the shape of the first opening 251 is different from that of the first opening 201 illustrated in FIG. 2A, and the shape of the second opening 252 is different from that of the second opening 202 illustrated in FIG. 2A. As illustrated in FIG. 4A, at least one of a side of the first opening 251 close to the second opening 252 and a side of the second opening 252 close to the first opening 251 includes a distance adjustment portion 510. FIG. 4A takes a case where the side of the first opening 251 close to the second opening 252 and the side of the second opening 252 close to the first opening 251 respectively include the distance adjustment portion 510 as an example for description. As illustrated in FIG. 4A, the first pixel defining portion 51 is configured to define the first opening 251, the second pixel defining portion 52 is configured to define the second opening 252, the third pixel defining portion 53 is configured to define the third opening 253, and the fourth pixel defining portion 54 is configured to define the fourth opening 254.

In FIG. 4A, the closed dashed box refers to a bottom portion of the opening, and the closed solid box close to the dashed box refers to a top portion of the opening. The portion of the PDL which is between the bottom portion bp and the top portion tp of each opening and defines the boundary of the opening is the pixel defining portion. The opening includes any one of the first opening 251, the second opening 252, the third opening 253, and the subsequently mentioned fourth opening 254. The pixel defining portion includes any one of the first pixel defining portion 51, the second pixel defining portion 52, the third pixel defining portion 53, and the subsequently mentioned fourth pixel defining portion 54. For example, the distance between the openings is a distance between opposite edges of top portions of the openings. For example, the embodiment of the present disclosure takes a case where the top portion of the opening corresponds to the light-emitting region of the sub-pixel as an example for description, which is not limited thereto.

For example, the distance adjustment portion 510 is configured such that a distance between the first opening 251 and the second opening 252 in a direction parallel with the base substrate gradually changes in a direction intersecting with an arrangement direction of the first opening 251 and the second opening 252. For example, the distance between the first opening 251 and the second opening 252 gradually increases from the center to two sides. For example, the distance between the first opening 251 and the second opening 252 gradually decreases and then gradually increases along the direction perpendicular to the arrangement direction of the first opening 251 and the second opening 252. The arrangement direction of the first opening 251 and the second opening 252 may be a vertical direction, and the direction perpendicular to the arrangement direction of the first opening 251 and the second opening 252 may be a horizontal direction.

For example, the third opening 253 and the fourth opening 243 of the PDL 215 illustrated in FIG. 4A may refer to the third opening 203 and the fourth opening 203 of the PDL 211 illustrated in FIG. 2A, respectively.

Figure 4B:
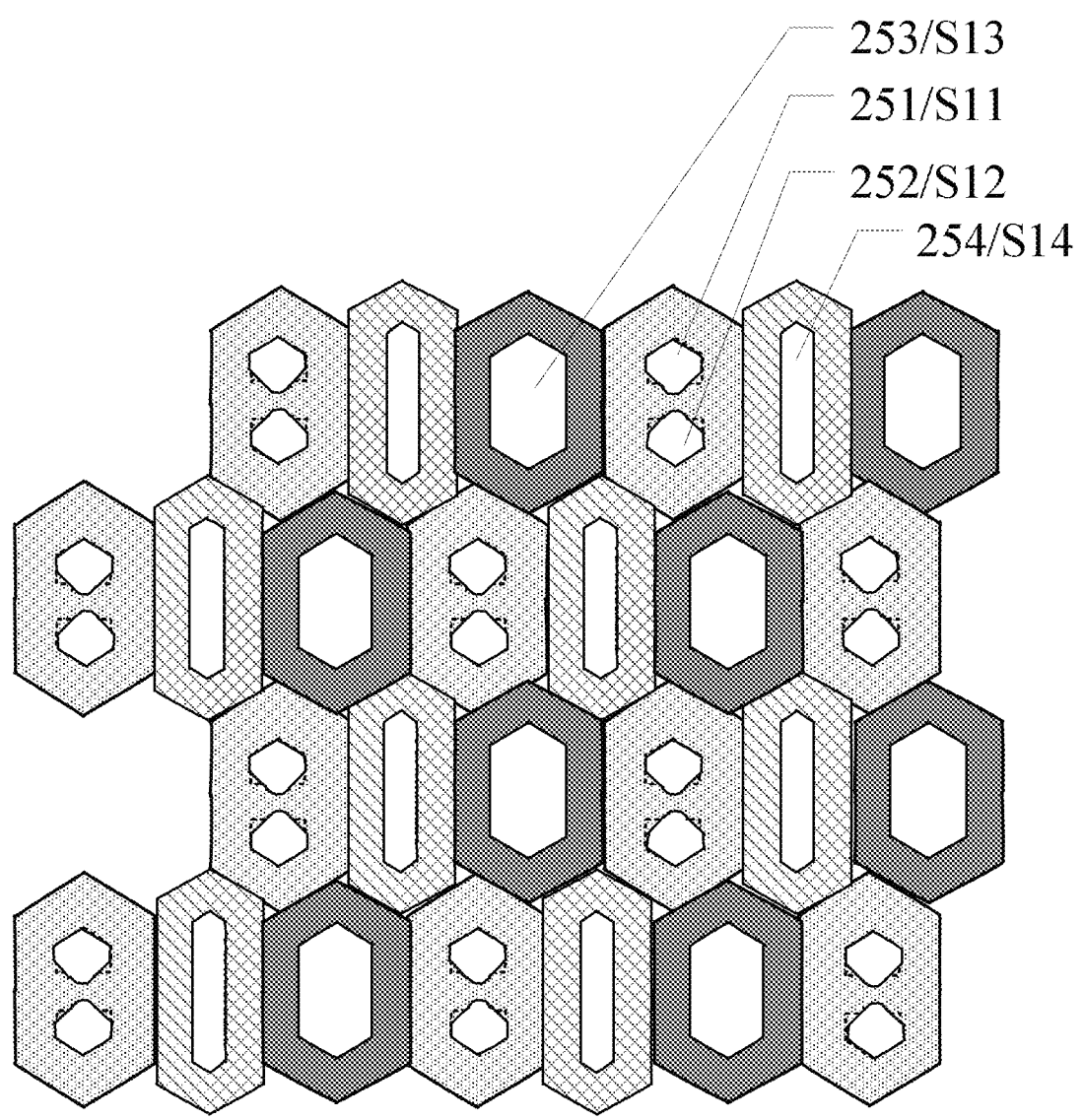
FIG. 4B is a schematic diagram of a pixel arrangement of an array substrate provided by an embodiment of the present disclosure.

FIG. 4B is a schematic diagram of a pixel arrangement of an array substrate provided by an embodiment of the present disclosure. As illustrated in FIG. 4B, the first opening 251, the second opening 252, the third opening 253, and the fourth opening 254 define a light-emitting region of the first sub-pixel S11, a light-emitting region of the second sub-pixel S12, a light-emitting region of the third sub-pixel S13, and a light-emitting region of the fourth sub-pixel S14, respectively; the first sub-pixel S11, the third sub-pixel S13, and the fourth sub-pixel S14 are sub-pixels of different colors, and the first sub-pixel S11 and the second sub-pixel S12 are sub-pixels of the same color. For example, the first sub-pixel S11 is a green sub-pixel, the third sub-pixel S13 is a blue sub-pixel, and the fourth sub-pixel S14 is a red sub-pixel.

According to the array substrate provided by the embodiment of the present disclosure, because the shapes of the first opening 251 and the second opening 252 are changed, the distance between opposite boundaries of the first opening 251 and the second opening 252 changes and the distance between the light-emitting regions of the first sub-pixel S11 and the second sub-pixel S12 correspondingly changes. Because the distance between the first opening 251 and the second opening 252 gradually increases from the center to the two sides, the flowability of the developing solution may be improved during the developing process of the manufacture of the PDL, thereby facilitating removal of the material of the PDL and reducing the slope angle of the portion of the PDL that is located between the first opening 251 and the second opening 252.

As illustrated in FIG. 4A, the first opening 251 and the second opening 252 are located between the third opening 253 and the fourth opening 254, and the first opening 251 and the second opening 252 are arranged at two sides of a line CL234 connecting a center C23 of the third opening 253 with a center C24 of the fourth opening 254, respectively. A ratio of a slope angle of a part 051 of the first pixel defining portion 51 located between the first opening 251 and the second opening 252 to a slope angle of the third pixel defining portion 53 or a ratio of a slope angle of a part 052 of the second pixel defining portion 52 located between the first opening 251 and the second opening 252 to the slope angle of the third pixel defining portion 53 is in a range from 0.8 to 1.25. Further, for example, the ratio is more than or equal to 1 and less than 1.2, which is not limited thereto.

For example, as illustrated in FIG. 4A, a ratio of the slope angle of the part 051 of the first pixel defining portion 51 located between the first opening 251 and the second opening 252 to a slope angle of the fourth pixel defining portion 54 or a ratio of the slope angle of the part 052 of the second pixel defining portion 52 located between the first opening 251 and the second opening 252 to the slope angle of the fourth pixel defining portion 54 is in a range from 0.8 to 1.25. Further, for example, the ratio is more than or equal to 1 and less than 1.2, which is not limited thereto.

The sectional view of the array substrate illustrated in FIG. 4A may refer to FIG. 2B and related descriptions thereof and will not be repeated herein. The position of the section line may refer to FIG. 2A.

For example, the first sub-pixel S11 illustrated in FIG. 4B and the first sub-pixel S1 illustrated in FIG. 3A are the same in area but are different in shape, and the second sub-pixel S12 illustrated in FIG. 4B and the second sub-pixel S2 illustrated in FIG. 3A are the same in area but are different in shape. For example, due to the diffraction effect during exposure, opposite positions of the opening regions of the first sub-pixel S11 and the second sub-pixel S12 in FIG. 4B are not a sharp corner, and are, for example, a rounded corner.

At least one embodiment of the present disclosure further provides a display device, including any one of the array substrate described above.

For example, the display device may be a display device such as a liquid crystal display, e-paper and an OLED display, and any product or component with a display function, such as a television, a digital camera, a mobile phone, a watch, a tablet computer, a laptop and a navigator including the above display device.

Figure 5:
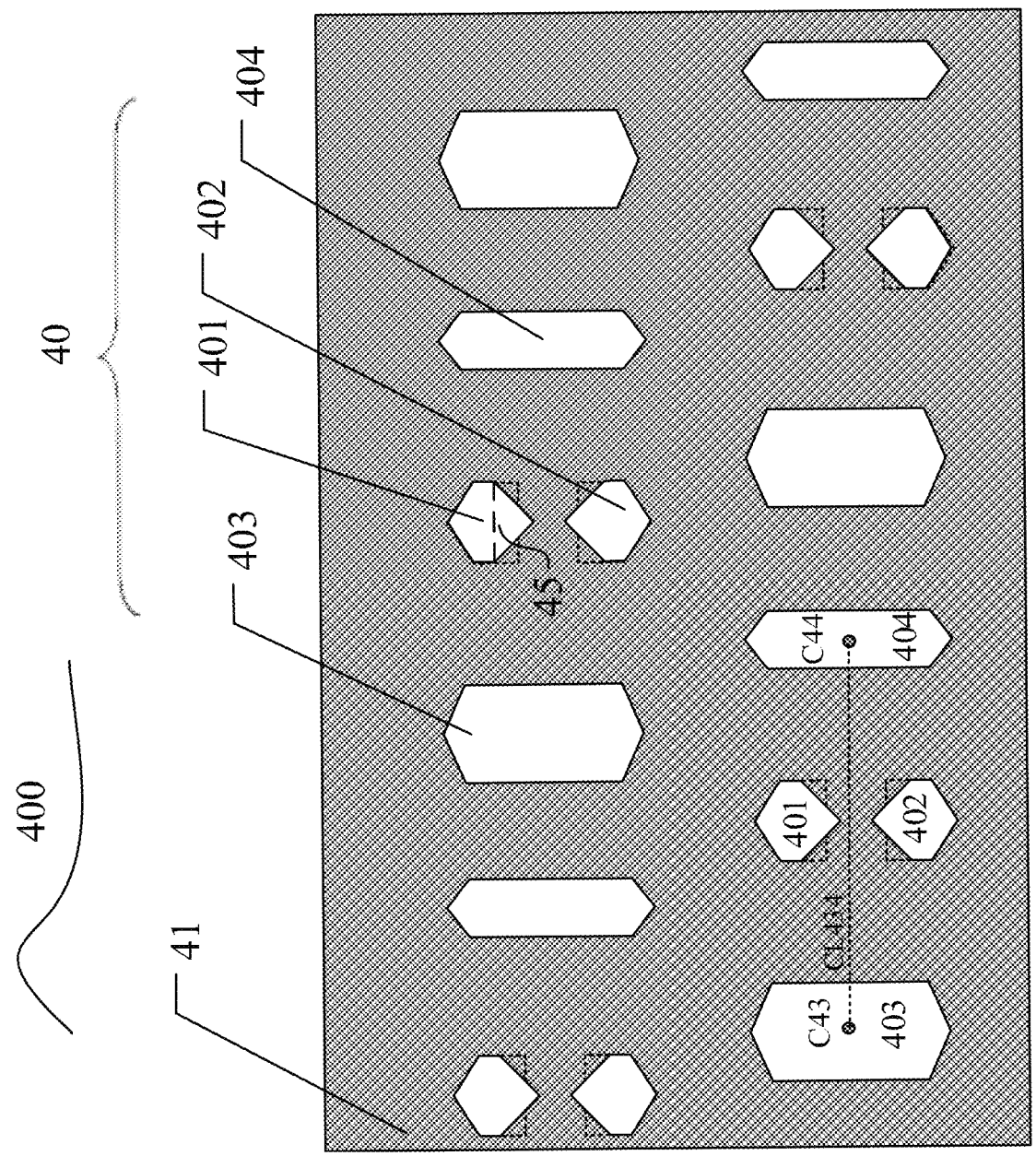
FIG. 5 is a top view of a mask plate provided by an embodiment of the present disclosure.
Figure 6:
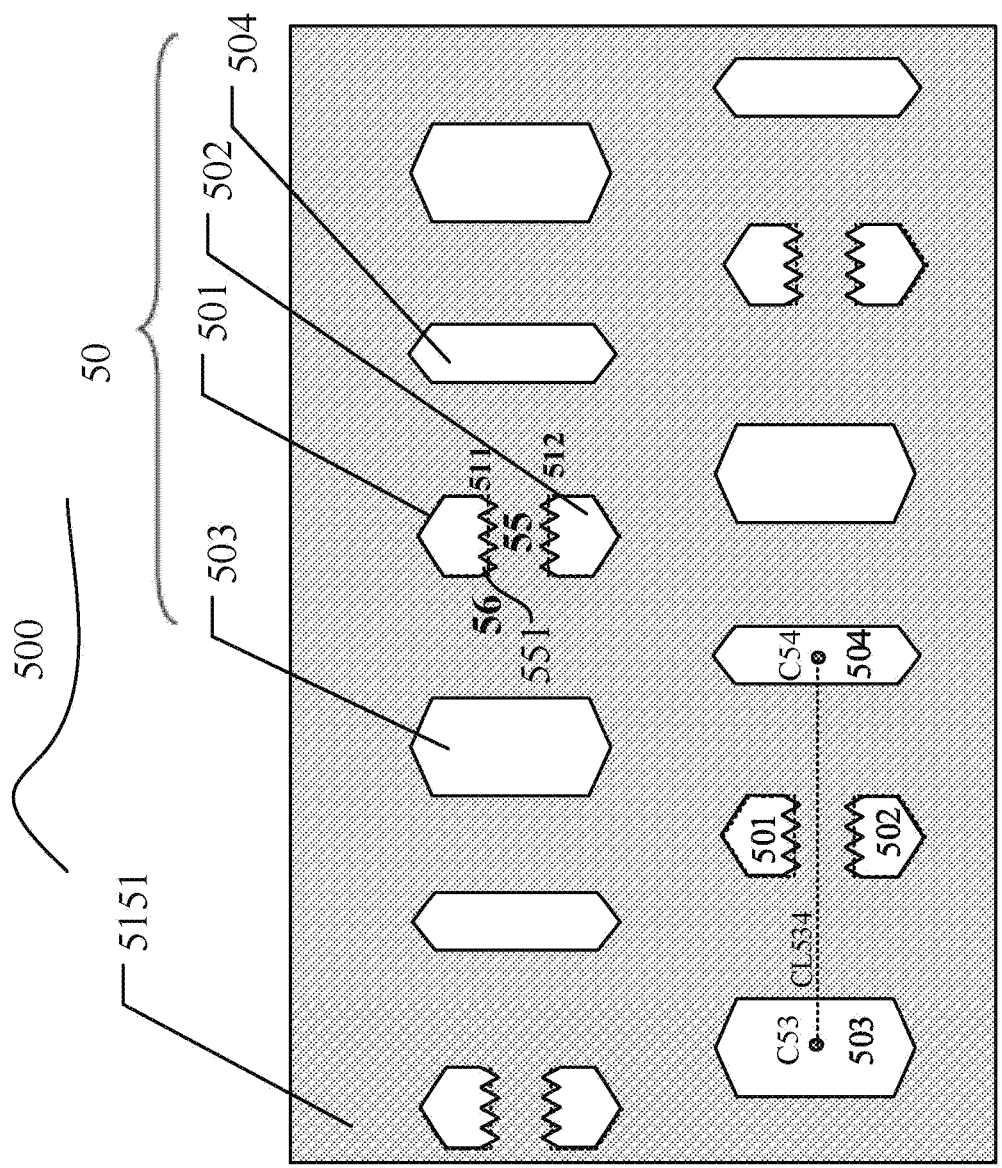
FIG. 6 is a top view of a mask plate provided by an embodiment of the present disclosure.
Figure 7:
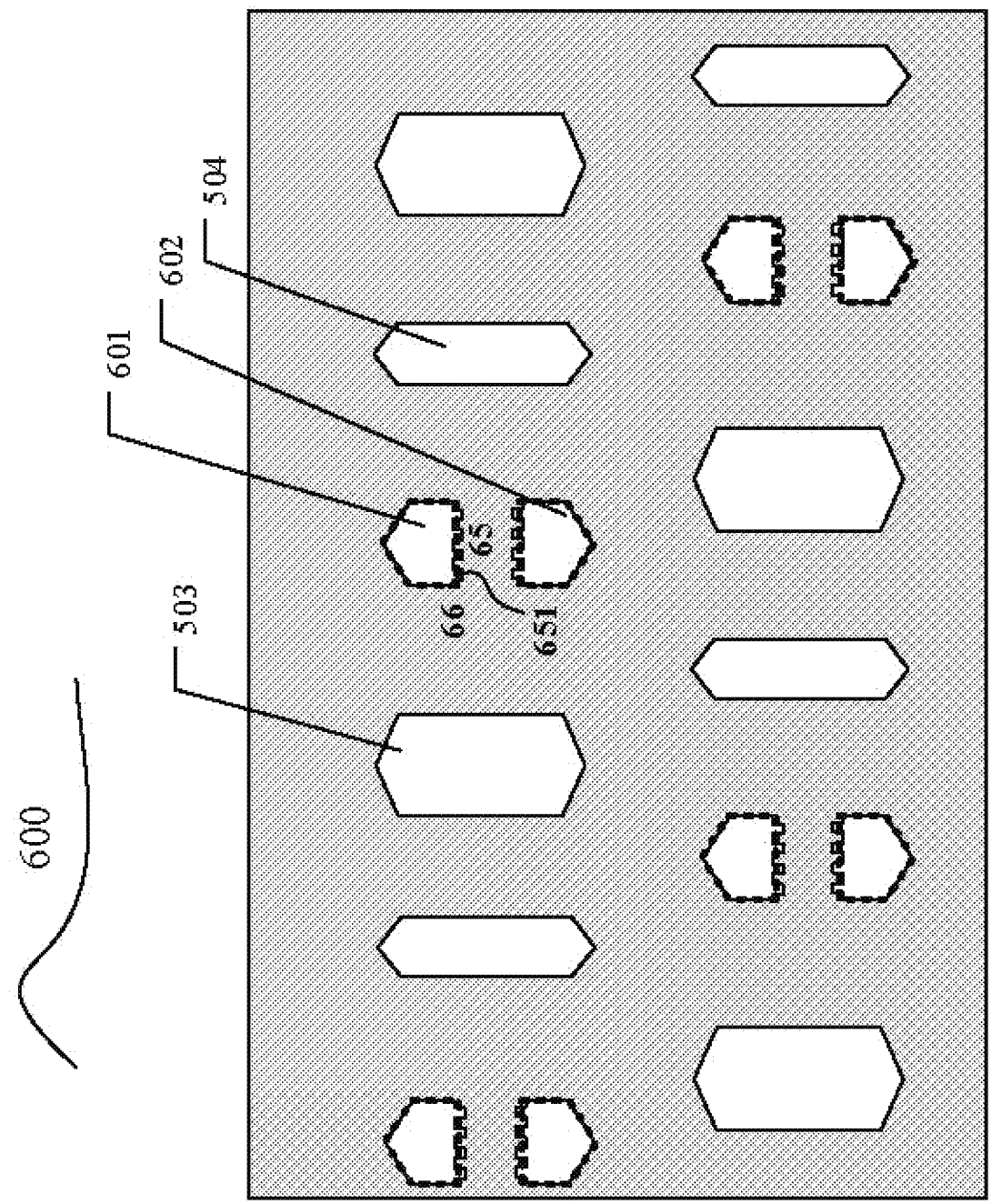
FIG. 7 is a top view of a mask plate provided by another embodiment of the present disclosure.

The PDL in the array substrate provided by the embodiment of the present disclosure and illustrated in FIG. 4A may be manufactured with the mask plate illustrated in FIG. 5, and the PDL in the array substrate provided by the embodiment of the present disclosure and illustrated in FIG. 2A and FIG. 2B may be manufactured with the mask plate illustrated in FIG. 6 or FIG. 7, such that the portion, located between the close sub-pixels, of the first pixel defining portion and/or second pixel defining portion has the smaller slope angle.

FIG. 5 is a top view of a mask plate provided by an embodiment of the present disclosure. The mask plate 400 includes: a pattern portion 40 and a filling portion 41; the pattern portion 40 includes a first pattern 401, a second pattern 402, and a third pattern 403; and the first pattern 401 is configured to form the first opening 251, the second pattern 402 is configured to form the second opening 252, and the third pattern 403 is configured to form the third opening 253. For example, referring to FIG. 4A, the PDL includes the first opening defining portion 51 configured to define the first opening 251, the second opening defining portion 52 configured to define the second opening 252, and the third opening defining portion 53 configured to define the third opening 253. For example, every two of the first pattern 401, the second pattern 402, and the third pattern 403 are adjacent to each other and spaced apart from each other. For example, the filling portion 41 is located in a region other than the pattern portion 40. For example, the filling portion 41 is at least located between every two of the first pattern 401, the second pattern 402, and the third pattern 403. Either the pattern portion 40 or the filling portion 41 is configured to transmit light, and the other is configured to block light. As illustrated in FIG. 5, at least one of a side of the first pattern 401 close to the second pattern 402 and a side of the second pattern 402 close to the first pattern 401 includes a protrusion 45. Referring to FIG. 4A and FIG. 5, the protrusion 45 is configured such that at least one of a ratio of a slope angle of a part 051 of the first pixel defining portion 51 located between the first opening 251 and the second opening 252 to a slope angle of the third pixel defining portion 53 and a ratio of a slope angle of a part 052 of the second pixel defining portion 52 located between the first opening 251 and the second opening 252 to the slope angle of the third pixel defining portion 53 is in a range from 0.8 to 1.25. For example, the protrusion 45 is configured such that a distance between the first pattern 401 and the second pattern 402 gradually changes.

For example, as illustrated in FIG. 5, the distance between the first pattern 401 and the second pattern 402 gradually increases from the center to two sides. According to the mask plate provided by the embodiment of the present disclosure, because the distance between the first pattern 401 and the second pattern 402 gradually changes, the distance between the first pattern 401 and the second pattern 402 may gradually increase. The first pattern 401 is configured to form the first opening of the PDL, i.e., the light-emitting region of the first sub-pixel, and the second pattern 402 is configured to form the second opening of the PDL, i.e., the light-emitting region of the second sub-pixel. Because the distance between the first pattern 401 and the second pattern 402 gradually increases from the center to the two sides, the mask plate provided by the embodiment can reduce the slope angle of the part of the first opening defining portion 51 located between the first opening and the second opening and/or the slope angle of the part of the second opening defining portion 52 located between the first opening and the second opening.

For example, as illustrated in FIG. 5, the protrusion 45 is of a triangle, which is not limited thereto, as long as the protrusion 45 can allow the distance between the first pattern 401 and the second pattern 402 to gradually change from the center to the two sides. For the ease of comparison, the pentagonal dashed lines in FIG. 5 illustrate the light-emitting regions of the first sub-pixel S1 and the second sub-pixel S2 illustrated in FIG. 3A. For example, as illustrated in FIG. 5, the distance between the first pattern 401 and the second pattern 402 gradually increases from the center to the two sides. For example, the distance between the first pattern 401 and the second pattern 402 gradually decreases and then gradually increases in a direction perpendicular to an arrangement direction of the first pattern 401 and the second pattern 402. For example, the arrangement direction of the first pattern 401 and the second pattern 402 may be a vertical direction, and the direction perpendicular to the arrangement direction of the first pattern 401 and the second pattern 402 may be a horizontal direction.

As illustrated in FIG. 5, the pattern portion 40 further includes a fourth pattern 404. Every two of the fourth pattern 404, the first pattern 401, and the second pattern 402 are adjacent to each other. The filling portion 41 is further located between every two of the first pattern 401, the second pattern 402, and the fourth pattern 404. For example, as illustrated in FIG. 5, a minimum distance between the first pattern 401 and the second pattern 402 is less than a minimum distance between the first pattern 401 and the third pattern 403, and less than a minimum distance between the first pattern 401 and the fourth pattern 404; and the first pattern 401 and the second pattern 402 are located between the third pattern 403 and the fourth pattern 404 and arranged at two sides of a line CL434 connecting a center C43 of the third pattern 403 with a center C44 of the fourth pattern 404, respectively. The first pattern 401 and the second pattern 402 may be configured to form the first opening 251 and the second opening 252 of the PDL illustrated in FIG. 4A, respectively; and the third pattern 403 and the fourth pattern 404 may be configured to form the third opening 253 and the fourth opening 254 of the PDL illustrated in FIG. 4A, respectively. As illustrated in FIG. 4A, the PDL further includes a fourth opening defining portion 54, and the fourth opening defining portion 54 is configured to define the fourth opening 254. For example, the protrusion 45 is further configured such that at least one of a ratio of the slope angle of the part 051 of the first opening defining portion 51 located between the first opening 251 and the second opening 252 to a slope angle of the fourth opening defining portion 54 for defining the fourth opening 254 and a ratio of the slope angle of the part 052 of the second opening defining portion 52 located between the first opening 251 and the second opening 252 to the slope angle of the fourth opening defining portion 54 is in a range from 0.8 to 1.25. Further, for example, the ratio is more than or equal to 1 and less than 1.2.

FIG. 6 is a top view of a mask plate provided by an embodiment of the present disclosure. As illustrated in FIG. 6, the mask plate 500 includes: a pattern portion 50 and a filling portion 5151; and the pattern portion 50 includes a first pattern 501, a second pattern 502, and a third pattern 503. For example, every two of the first pattern 501, the second pattern 502, and the third pattern 503 are adjacent to each other and spaced apart from each other. The filling portion 5151 is located in a region other than the pattern portion 50. For example, the filling portion 5151 is at least located between every two of the first pattern 501, the second pattern 502, and the third pattern 503. Either the pattern portion 50 or the filling portion 5151 is configured to transmit light, and the other is configured to block light. The mask plate 500 is configured to form the PDL illustrated in FIG. 2A. As illustrated in FIG. 2A, the PDL is provided with the first opening 201, the second opening 202, and the third opening 203, and the PDL includes the first pixel defining portion 21, the second pixel defining portion 22, and the third pixel defining portion 23. At least one of a side of the first pattern 501 close to the second pattern 502 and a side of the second pattern 502 close to the first pattern 501 includes a protrusion 55; and the protrusion 55 is configured such that at least one of the ratio of the slope angle of the part 021 of the first opening defining portion 21 located between the first opening 201 and the second opening 202 to the slope angle of the third opening defining portion 23 or the ratio of the slope angle of the portion 022 of the second opening defining portion 22 located between the first opening 201 and the second opening 202 to the slope angle of the third opening defining portion 23 is in a range from 0.8 to 1.25. For example, the protrusion 55 and a part of the filling portion 5151 form an optical compensation portion 56. The optical compensation portion 56 is configured to transmit a part of light irradiated onto the optical compensation portion 56 in a diffractive manner. Because a part of light may transmit through the optical compensation portion 56 during the exposure, compared with a case where the optical compensation portion 56 is not provided, a part of material of the portion of the PDL for forming the opening at the optical compensation portion 56 may be removed, thereby reducing the slope angle of the portion of the PDL for forming the opening.

For example, the first pattern 501 and the second pattern 502 may be configured to form the first opening 201 and the second opening 202 of the PDL illustrated in FIG. 2A and FIG. 2B, respectively; and the third pattern 503 and the fourth pattern 404 may be configured to form the third opening 203 and the fourth opening 204 of the PDL illustrated in FIG. 2A and FIG. 2B, respectively.

As illustrated in FIG. 6, the protrusion 55 includes a plurality of sub-protrusions 551, and the plurality of sub-protrusions 551 are sequentially arranged in a direction intersecting with an arrangement direction of the first pattern 401 and the second pattern 402. For example, as illustrated in FIG. 6, the first pattern 501 and the second pattern 502 are arranged along a vertical direction, and the plurality of sub-protrusions 551 are arranged along a horizontal direction, which is not limited thereto. The mask plate illustrated in FIG. 6 may be used to form the first opening 201 and the second opening 202 illustrated in the top view of FIG. 2B. For example, as illustrated in FIG. 6, the plurality of sub-protrusions 551 are sequentially arranged along an extension direction of each of a boundary of the first pattern 501 and a boundary of the second pattern 502 that are opposite to each other. FIG. 6 illustrates the boundary 511 of the first pattern 501 that is opposite to the second pattern 502, and the boundary 512 of the second pattern 502 that is opposite to the first pattern 501. For example, as illustrated in FIG. 6, the boundary, opposite to the second pattern 502, of the first pattern 501 is of the zigzag shape, and the boundary 521, opposite to the first pattern 501, of the second pattern 502 is of the zigzag shape. For example, as illustrated in FIG. 6, the plurality of sub-protrusions 551 of the first pattern 501 are sequentially arranged along the extension direction of the boundary 511, opposite to the second pattern 502, of the first pattern 501, and the plurality of sub-protrusions 551 of the second pattern 502 are sequentially arranged along the boundary 512, opposite to the first pattern 501, of the second pattern 502.

As illustrated in FIG. 6, the pattern portion 50 further includes a fourth pattern 504, and every two of the fourth pattern 504, the first pattern 501, and the second pattern 502 are adjacent to each other. For example, a minimum distance between the first pattern 501 and the second pattern 502 is less than a minimum distance between the first pattern 501 and the third pattern 503, and less than a minimum distance between the first pattern 501 and the fourth pattern 504. For example, the first pattern 501 and the second pattern 502 are located between the third pattern 503 and the fourth pattern 504 and arranged at two sides of a line CL534 connecting a center C53 of the third pattern 503 with a center C54 of the fourth pattern 504, respectively. The first pattern 501 and the second pattern 502 may be configured to form the first opening 201 and the second opening 202 of the PDL illustrated in FIG. 2A and FIG. 2B, respectively; and the third pattern 503 and the fourth pattern 504 may be configured to form the third opening 203 and the fourth opening 204 of the PDL illustrated in FIG. 2A and FIG. 2B, respectively. For example, the minimum distance and/or the maximum distance between the first pattern 501 and the second pattern 502 is less than the minimum distance between the first pattern 501 and the third pattern 503, and less than the minimum distance between the first pattern 501 and the fourth pattern 504.

For example, each sub-protrusion 551 has a size less than a resolution of an exposure machine. The exposure intensity of the PDL material at the corresponding position of the optical compensation portion may be between the case where the position is shielded with a mask plate and the case where the position is not shielded with a mask plate, thereby reducing the slope angle of the PDL. For example, as illustrated in FIG. 6, a part of the filling portion 5151 is provided between adjacent sub-protrusions 551. The light shielding portions and the light transmission portions are alternately arranged, such that the light irradiated onto the optical compensation portion 56 is diffracted, thereby reducing the slope angle of the portion of the PDL that is located between the first opening 201 and the second opening 202 and forming the first opening 201 and/or the second opening 202.

For example, as illustrated in FIG. 6, each sub-protrusion 551 includes a triangle. For example, at least one of a bottom length and a height of the triangle is less than or equal to 1.5 µm.

For example, the pentagonal dashed line illustrated in FIG. 6 refers to the first opening 201 or the second opening 202 of the PDL formed by the mask plate illustrated in FIG. 6; and the protrusion 55 of the first pattern 501 includes a portion protruded from the first opening 201 and a portion located in the first opening 201, which is not limited thereto.

For example, as illustrated in FIG. 6, the protrusion 55 of the second pattern 502 includes a portion protruded from the second opening 202 and a portion located in the second opening 202, which is not limited thereto. As illustrated in FIG. 6, the side of the first pattern 501 close to the second pattern 502 and the side of the second pattern 502 close to the first pattern 501 are formed into a zigzag shape.

FIG. 7 is a top view of a mask plate provided by another embodiment of the present disclosure. The differences between the mask plate 600 provided by the embodiment and the mask plate 500 illustrated in FIG. 6 lie in: the mask plate 600 includes a first pattern 601 and a second pattern 602; at least one of a side of the first pattern 601 close to the second pattern 602 and a side of the second pattern 602 close to the first pattern 601 includes a protrusion 65; the protrusion 65 includes a plurality of sub-protrusions 651; and each sub-protrusion 651 includes a rectangle. For example, at least one of a length and a width of the rectangle is less than or equal to 1.5 µm. As illustrated in FIG. 7, the boundary of each of the side of the first pattern 601 close to the second pattern 602 and the side of the second pattern 602 close to the first pattern 601 is formed into a square waveform 66.

For example, the pentagonal dashed line illustrated in FIG. 7 refers to the first opening 201 or the second opening 202 of the PDL formed by the mask plate illustrated in FIG. 7; and the protrusion 65 of the first pattern 601 includes a portion protruded from the first opening 201 and a portion located in the first opening 201, which is not limited thereto. For example, as illustrated in FIG. 7, the protrusion 65 of the second pattern 602 includes a portion protruded from the second opening 202 and a portion located in the second opening 202, which is not limited thereto.

For example, in some embodiments, the material of the PDL includes a positive PR, the pattern portion is the light transmission portion, and the filling portion is the light shielding portion, which is not limited thereto.

For example, in some embodiments, the material of the PDL includes a negative PR, the pattern portion is the light shielding portion, and the filling portion is the light transmission portion.

At least one embodiment of the present disclosure further provides a manufacturing method of an array substrate, which includes manufacturing a PDL with any one of the mask plates described above.

For example, in the embodiment of the present disclosure, the manufacturing method of the PDL includes: forming a pixel defining thin film, exposing the pixel defining thin film with the mask plate, developing the pixel defining thin film, forming the PDL and forming openings penetrating the PDL.

It is to be noted that, in the embodiment of the present disclosure, the optical compensation portion is not limited to the shape illustrated in FIG. 6 and FIG. 7.

It should be noted that, for the purpose of clarity only, in accompanying drawings for illustrating the embodiment(s) of the present disclosure, the thickness and size of a layer or a structure may be enlarged. However, it should be understood that, in the case where a component such as a layer, film, area, substrate or the like is referred to be "on" or "under" another component, it may be directly on or under the another component or a component is interposed therebetween.

In the embodiments of the present disclosure, patterning or a patterning process may include only a photolithography process, or include a photolithography process and an etching process, or may include other processes for forming a predetermined pattern, such as a printing process, an inkjet process, and the like. A photolithography process includes forming a pattern by processes such as film forming, exposure, and development etc., by using photoresist, mask, exposure machine etc. The corresponding patterning process may be selected according to the structure formed in the embodiments of the present disclosure.

In case of no conflict, features in one embodiment or in different embodiments can be combined.

The above are the embodiments of the present disclosure only without construing any limitation to the scope of the present disclosure; any of those skilled in related arts may easily conceive variations and substitutions in the technical scopes disclosed by the present disclosure, which should be encompassed in protection scopes of the present disclosure. Therefore, the scopes of the present disclosure should be defined in the appended claims.

What is claimed is:

1. An array substrate, comprising a pixel defining layer (PDL), wherein the PDL is provided with a first opening, a second opening, and a third opening that penetrate the PDL, and every two of the first opening, the second opening, and the third opening are adjacent to each other;
   a minimum distance between the first opening and the second opening is less than a minimum distance between the first opening and the third opening;
   the PDL comprises a first opening defining portion, a second opening defining portion, and a third opening defining portion; the first opening defining portion is configured to define the first opening, the second opening defining portion is configured to define the second opening, and the third opening defining portion is configured to define the third opening; and
   at least one of a ratio of a slope angle of a part of the first opening defining portion located between the first opening and the second opening to a slope angle of the third opening defining portion and a ratio of a slope angle of a part of the second opening defining portion located between the first opening and the second opening to the slope angle of the third opening defining portion is in a range from 0.8 to 1.25.

2. The array substrate according to claim 1, wherein at least one of the ratio of the slope angle of the part of the first opening defining portion located between the first opening and the second opening to the slope angle of the third opening defining portion and the ratio of the slope angle of the part of the second opening defining portion located between the first opening and the second opening to the slope angle of the third opening defining portion is more than or equal to 1 and less than 1.2.

3. The array substrate according to claim 1, wherein the slope angle of the part of the first opening defining portion located between the first opening and the second opening or the slope angle of the part of the second opening defining portion located between the first opening and the second opening is in a range from 28° to 35°.

4. The array substrate according to claim 1, wherein a ratio of a size of an orthographic projection of the part of the first opening defining portion located between the first opening and the second opening or the part of the second opening defining portion located between the first opening and the second opening on a base substrate to a size of an orthographic projection of a part of the PDL located between the first opening and the second opening on the base substrate is in a range from 0.10 to 0.25.

5. The array substrate according to claim 1, wherein the PDL is further provided with a fourth opening penetrating the PDL, every two of the fourth opening, the first opening, and the second opening are adjacent to each other, the PDL further comprises a fourth opening defining portion, and the fourth opening defining portion is configured to define the fourth opening; the minimum distance between the first opening and the second opening is further less than a minimum distance between the first opening and the fourth opening; and the first opening and the second opening are located between the third opening and the fourth opening, and the first opening and the second opening are arranged at two sides of a line connecting a center of the third opening with a center of the fourth opening, respectively; and
   at least one of a ratio of the slope angle of the part of the first opening defining portion located between the first opening and the second opening to a slope angle of the fourth opening defining portion and a ratio of the slope angle of the part of the second opening defining portion located between the first opening and the second opening to the slope angle of the fourth opening defining portion is in a range from 0.8 to 1.25.

6. The array substrate according to claim 5, wherein the first opening, the second opening, the third opening, and the fourth opening define a light-emitting region of a first sub-pixel, a light-emitting region of a second sub-pixel, a light-emitting region of a third sub-pixel, and a light-emitting region of a fourth sub-pixel, respectively; the first sub-pixel, the third sub-pixel, and the fourth sub-pixel are sub-pixels of different colors; and the first sub-pixel and the second sub-pixel are sub-pixels of a same color.

7. The array substrate according to claim 5, wherein an area of the first opening is equal to an area of the second opening, the area of the first opening is less than an area of the fourth opening, and the area of the fourth opening is less than an area of the third opening.

8. The array substrate according to claim 1, wherein the PDL is provided on a base substrate, at least one of a side of the first opening close to the second opening and a side of the second opening close to the first opening is provided with a distance adjustment portion, and the distance adjustment portion is configured such that a distance between the first opening and the second opening in a direction parallel with the base substrate gradually changes in a direction intersecting with an arrangement direction of the first opening and the second opening.

9. The array substrate according to claim 8, wherein the distance adjustment portion is configured such that the distance between the first opening and the second opening in the direction parallel with the base substrate gradually decreases and then gradually increases in the direction intersecting with the arrangement direction of the first opening and the second opening.

10. The array substrate according to claim 1, wherein the PDL is provided on a base substrate, a distance between a side of the first opening close to the second opening and a side of the second opening close to the first opening in a direction parallel with the base substrate is a fixed value in the direction intersecting with an arrangement direction of the first opening and the second opening.

11. A display device, comprising the array substrate according to claim 1.

12. A mask plate, comprising:
   a pattern portion, comprising a first pattern, a second pattern, and a third pattern; and
   a filling portion, located in a region other than the pattern portion, wherein one of the pattern portion and the filling portion is configured to transmit light, and the other of the pattern portion and the filling portion is configured to block light;

at least one of a side of the first pattern close to the second pattern and a side of the second pattern close to the first pattern comprises a protrusion.

13. The mask plate according to claim 12, wherein the protrusion is configured such that a distance between the first pattern and the second pattern gradually changes.

14. The mask plate according to claim 13, wherein the protrusion is of a triangle, and the distance between the first pattern and the second pattern gradually decreases and then gradually increases in a direction perpendicular to an arrangement direction of the first pattern and the second pattern.

15. The mask plate according to claim 12, wherein the protrusion and a part of the filling portion form an optical compensation portion, and the optical compensation portion is configured to transmit a part of light irradiated onto the optical compensation portion in a diffractive manner.

16. The mask plate according to claim 15, wherein the protrusion comprises a plurality of sub-protrusions, and the plurality of sub-protrusions are sequentially arranged along an extension direction of each of a boundary of the first pattern and a boundary of the second pattern that are opposite to each other.

17. The mask plate according to claim 16, wherein a part of the filling portion is provided between adjacent ones of the plurality of sub-protrusions, wherein each of the plurality of sub-protrusions has a size less than a resolution of an exposure machine.

18. The mask plate according to claim 16, wherein each of the plurality of sub-protrusions comprises at least one of a triangle and a rectangle, at least one of a bottom length and a height of the triangle is less than or equal to 1.5 µm, and at least one of a length and a width of the rectangle is less than or equal to 1.5 µm.

19. A manufacturing method of an array substrate, comprising manufacturing a pixel defining layer (PDL) with a mask plate, wherein the mask plate comprises:

a pattern portion, comprising a first pattern, a second pattern, and a third pattern; and a filling portion, located in a region other than the pattern portion, wherein one of the pattern portion and the filling portion is configured to transmit light, and the other of the pattern portion and the filling portion is configured to block light;

at least one of a side of the first pattern close to the second pattern and a side of the second pattern close to the first pattern comprises a protrusion, wherein the PDL is provided with a first opening, a second opening, and a third opening that penetrate the PDL, and every two of the first opening, the second opening, and the third opening are adjacent to each other;

a minimum distance between the first opening and the second opening is less than a minimum distance between the first opening and the third opening;

the PDL comprises a first opening defining portion, a second opening defining portion, and a third opening defining portion; the first opening defining portion is configured to define the first opening, the second opening defining portion is configured to define the second opening, and the third opening defining portion is configured to define the third opening, the first pattern is configured to form the first opening, the second pattern is configured to form the second opening, and the third pattern is configured to form the third opening, and the protrusion is configured such that at least one of a ratio of a slope angle of a part of the first opening defining portion located between the first opening and the second opening to a slope angle of the third opening defining portion and a ratio of a slope angle of a part of the second opening defining portion located between the first opening and the second opening to the slope angle of the third opening defining portion is in a range from 0.8 to 1.25.

20. The manufacturing method of the array substrate according to claim 19, wherein the PDL is further provided with a fourth opening penetrating the PDL, the PDL further comprises a fourth opening defining portion configured to define the fourth opening, the pattern portion further comprises a fourth pattern, and the fourth pattern is configured to form the fourth opening;

a minimum distance between the first pattern and the second pattern is less than a minimum distance between the first pattern and the third pattern, and less than a minimum distance between the first pattern and the fourth pattern;

the first pattern and the second pattern are located between the third pattern and the fourth pattern and arranged at two sides of a line connecting a center of the third pattern with a center of the fourth pattern, respectively; and the protrusion is further configured such that at least one of a ratio of the slope angle of the part of the first opening defining portion located between the first opening and the second opening to a slope angle of the fourth opening defining portion and a ratio of the slope angle of the part of the second opening defining portion located between the first opening and the second opening to the slope angle of the fourth opening defining portion is in a range from 0.8 to 1.25.

\* \* \* \* \*